(12) United States Patent
Yang

(10) Patent No.: US 12,689,380 B2
(45) Date of Patent: Jul. 21, 2026

(54) DELAY LOCKED LOOP DEVICE AND METHOD FOR OPERATING THE SAME

(71) Applicant: NANYA TECHNOLOGY CORPORATION, New Taipei City (TW)

(72) Inventor: Wu-Der Yang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 100 days.

(21) Appl. No.: 18/909,128

(22) Filed: Oct. 8, 2024

(65) Prior Publication Data

US 2026/0100712 A1 Apr. 9, 2026

(51) Int. Cl.
*G11C 11/4076* (2006.01)
*H03L 7/08* (2006.01)
*H03L 7/081* (2006.01)
*H03L 7/085* (2006.01)
*H03L 7/18* (2006.01)

(52) U.S. Cl.
CPC ........ *H03L 7/0812* (2013.01); *G11C 11/4076* (2013.01); *H03L 7/085* (2013.01); *H03L 7/18* (2013.01)

(58) Field of Classification Search
CPC ......... H03L 7/085; H03L 7/18; H03L 7/0812; G11C 11/4076
See application file for complete search history.

(56) References Cited

U.S. PATENT DOCUMENTS

| | | | | | |
|---|---|---|---|---|---|
| 6,377,093 | B1* | 4/2002 | Lee | ..................... | H03L 7/0814 |
| | | | | | 327/276 |
| 2001/0033630 | A1* | 10/2001 | Hassoun | ................... | G06F 1/10 |
| | | | | | 327/158 |
| 2008/0116950 | A1* | 5/2008 | Baek | ......................... | H03L 7/16 |
| | | | | | 327/158 |
| 2010/0156486 | A1* | 6/2010 | Yun | ...................... | H03L 7/0816 |
| | | | | | 327/158 |
| 2011/0187413 | A1* | 8/2011 | Suzuki | ...................... | H03L 7/06 |
| | | | | | 327/12 |
| 2015/0213873 | A1* | 7/2015 | Joo | ......................... | H03L 7/083 |
| | | | | | 365/194 |
| 2024/0356556 | A1* | 10/2024 | Kung | .................... | H03L 7/0891 |

* cited by examiner

*Primary Examiner* — Khamdan N. Alrobaie
(74) *Attorney, Agent, or Firm* — Xuan Zhang

(57) ABSTRACT

A delay locked loop device is provided, which includes a receiver, a delay line, a frequency detection and control circuit, a phase detector, and a delay control circuit. The receiver compares an input clock signal and a reference voltage to generate a first signal, and generate a reference clock signal based on the input clock signal. The delay line delays the first signal to generate a second signal based on a delay control signal. The frequency detection and control circuit detects an operating frequency of the reference clock signal to generate an enable signal. The phase detector detects, in response to the enable signal, a phase difference between the reference clock signal and a feedback clock signal to generate a phase detection result. The delay control circuit is configured to generate the delay control signal for the delay line based on the phase detection result.

10 Claims, 16 Drawing Sheets

REF_CLK

FB_CLK

PD_EN t0      t1      t2      t3      t4      t5      t6

REF_CLK

FB_CLK

PD_EN

REF_CLK

REF_DCLK
(/R1)

FB_CLK

FB_DCLK
(/R1)

t0     t1     t2     t3     t4     t5     t6

REF_CLK

REF_DCLK
(/R3)

FB_CLK

FB_DCLK
(/R3)

t0   t1   t2   t3   t4   t5   t6   t7   t8   t9   t10

Figure 7:
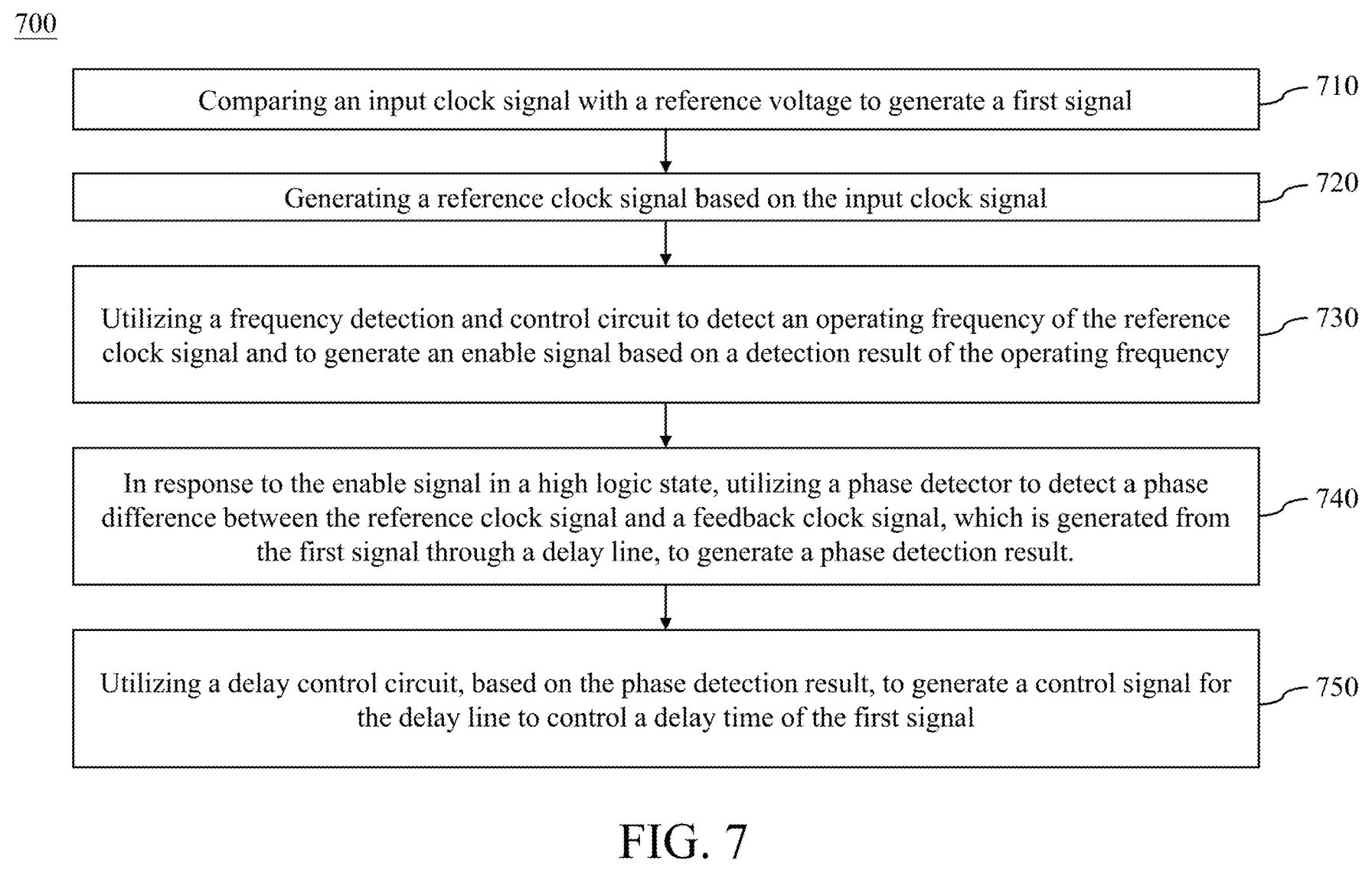

700

710 — Comparing an input clock signal with a reference voltage to generate a first signal 720 — Generating a reference clock signal based on the input clock signal 730 — Utilizing a frequency detection and control circuit to detect an operating frequency of the reference clock signal and to generate an enable signal based on a detection result of the operating frequency 740 — In response to the enable signal in a high logic state, utilizing a phase detector to detect a phase difference between the reference clock signal and a feedback clock signal, which is generated from the first signal through a delay line, to generate a phase detection result.

750 — Utilizing a delay control circuit, based on the phase detection result, to generate a control signal for the delay line to control a delay time of the first signal

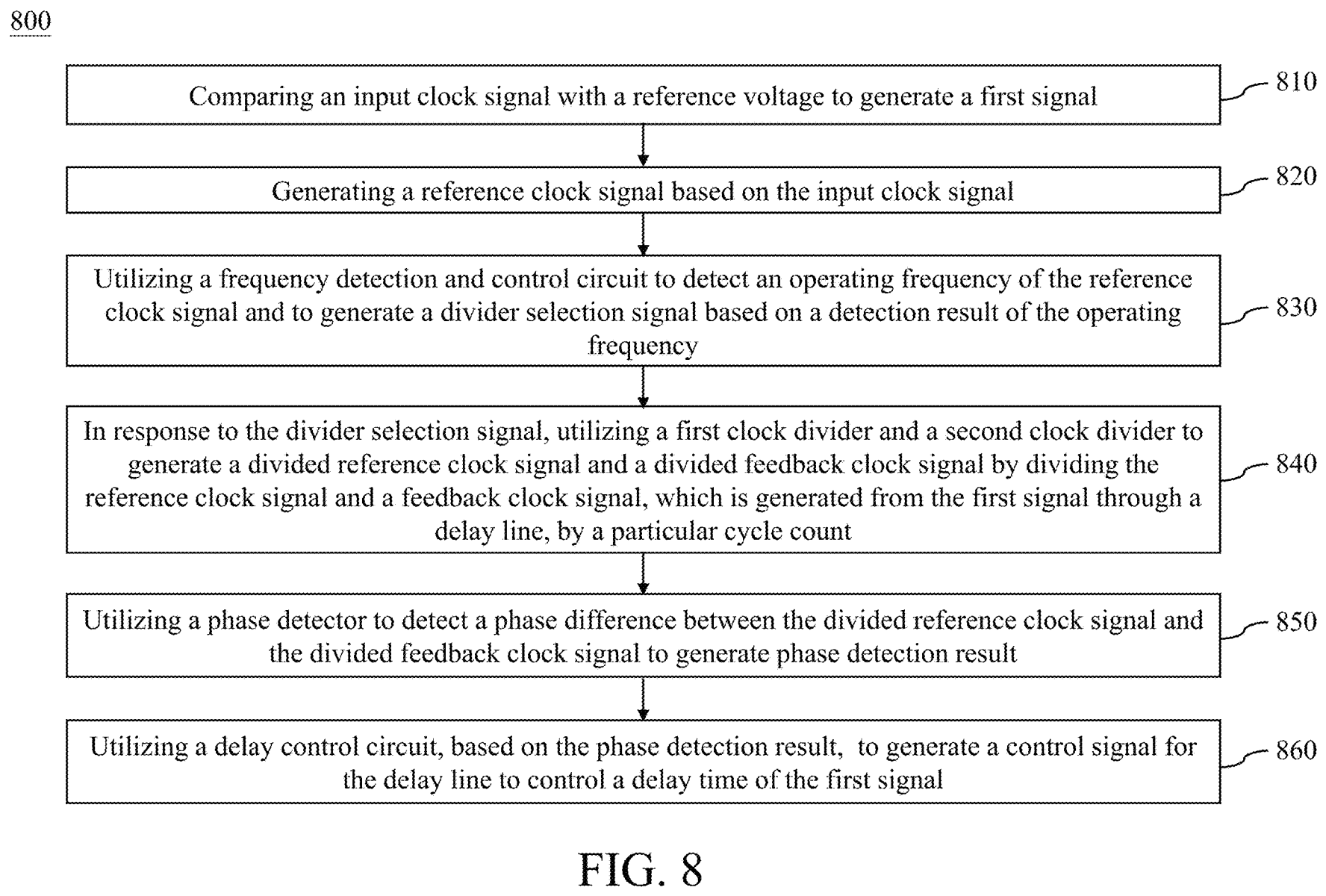

810 — Comparing an input clock signal with a reference voltage to generate a first signal 820 — Generating a reference clock signal based on the input clock signal 830 — Utilizing a frequency detection and control circuit to detect an operating frequency of the reference clock signal and to generate a divider selection signal based on a detection result of the operating frequency 840 — In response to the divider selection signal, utilizing a first clock divider and a second clock divider to generate a divided reference clock signal and a divided feedback clock signal by dividing the reference clock signal and a feedback clock signal, which is generated from the first signal through a delay line, by a particular cycle count 850 — Utilizing a phase detector to detect a phase difference between the divided reference clock signal and the divided feedback clock signal to generate phase detection result 860 — Utilizing a delay control circuit, based on the phase detection result, to generate a control signal for the delay line to control a delay time of the first signal

FIG. 8

DELAY LOCKED LOOP DEVICE AND METHOD FOR OPERATING THE SAME

TECHNICAL FIELD

The present disclosure relates to electronic circuits, and more particularly, to a delay locked loop device and method for operating the same.

DISCUSSION OF THE BACKGROUND

A delay locked loop device is configured to delay a clock signal by a delay time to output a corresponding output signal. However, the delay locked loop device needs to receive an external voltage for operations, and when the external voltage is unstable, the delay time is affected and problems of latency jump may occur. Thus, resolution of problems such as those described is a priority.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

An aspect of the present disclosure provides a delay locked loop device, which includes a receiver, a delay line, a frequency detection and control circuit, a phase detector, and a delay control circuit. The receiver is configured to compare an input clock signal and a reference voltage to generate a first signal and generate a reference clock signal based on the input clock signal. The delay line is configured to delay the first signal to generate a second signal based on a delay control signal. The frequency detection and control circuit is configured to detect an operating frequency of the reference clock signal to generate an enable signal. The phase detector is configured to detect, in response to the enable signal in a high logic state, a phase difference between the reference clock signal and a feedback clock signal, which is generated from the second signal, to generate a phase detection result. The delay control circuit is configured to generate the delay control signal for the delay line based on the phase detection result.

Another aspect of the present disclosure provides a delay locked loop device which includes a receiver, a delay line, a frequency detection and control circuit, a first clock divider, a second clock divider, a phase detector, and a delay control circuit. The receiver is configured to compare an input clock signal and a reference voltage to generate a first signal and generate a reference clock signal based on the input clock signal. The delay line is configured to delay the first signal to generate a second signal based on a delay control signal. The frequency detection and control circuit is configured to detect an operating frequency of the reference clock signal to generate a divider selection signal. The first clock divider is configured to divide, based on the divider selection signal, the reference clock signal using a specific cycle count among a plurality of cycle counts to generate a divided reference clock signal. The second clock divider is configured to divide, based on the divider selection signal, a feedback clock signal generated from the second signal to generate a divided feedback clock signal. The phase detector is configured to detect a phase difference between the divided reference clock signal and the divided feedback clock signal to generate a phase detection result. The delay control circuit is configured to generate the delay control signal for the delay line based on the phase detection result.

Yet another aspect of the present disclosure provides a method for operating a delay locked loop device which includes a delay line, a frequency detection and control circuit, a phase detector, and a delay control circuit. The method includes the following steps: comparing an input clock signal with a reference voltage to generate a first signal; generating a reference clock signal based on the input clock signal; utilizing the frequency detection and control circuit to detect an operating frequency of the reference clock signal and to generate an enable signal based on a detection result of the operating frequency; in response to the enable signal in a high logic state, utilizing the phase detector to detect a phase difference between the reference clock signal and a feedback clock signal, which is generated from the first signal through the delay line, to generate a phase detection result; and utilizing the delay control circuit, based on the phase detection result, to generate a delay control signal for the delay line to control a delay time of the first signal.

In some embodiments, the delay locked loop device is capable of dynamically adjusting the activation period of the phase detector based on the operating frequency of the memory device, and is designed to detect the phase difference between the reference clock signal REF_CLK and the feedback clock signal FB_CLK. Accordingly, the delay locked loop device effectively mitigates latency jump issues that may arise from timing drifts in the delay-locked loop (DLL) caused by significant fluctuations in the external power supply voltage (VDD).

The foregoing outlines rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 7 is a flowchart of a method for operating a delay locked loop device in accordance with some embodiments of the present disclosure.

FIG. 8 is a flowchart of a method for operating a delay locked loop device in accordance with still some embodiments of the present disclosure.

DETAILED DESCRIPTION

Figure 1:
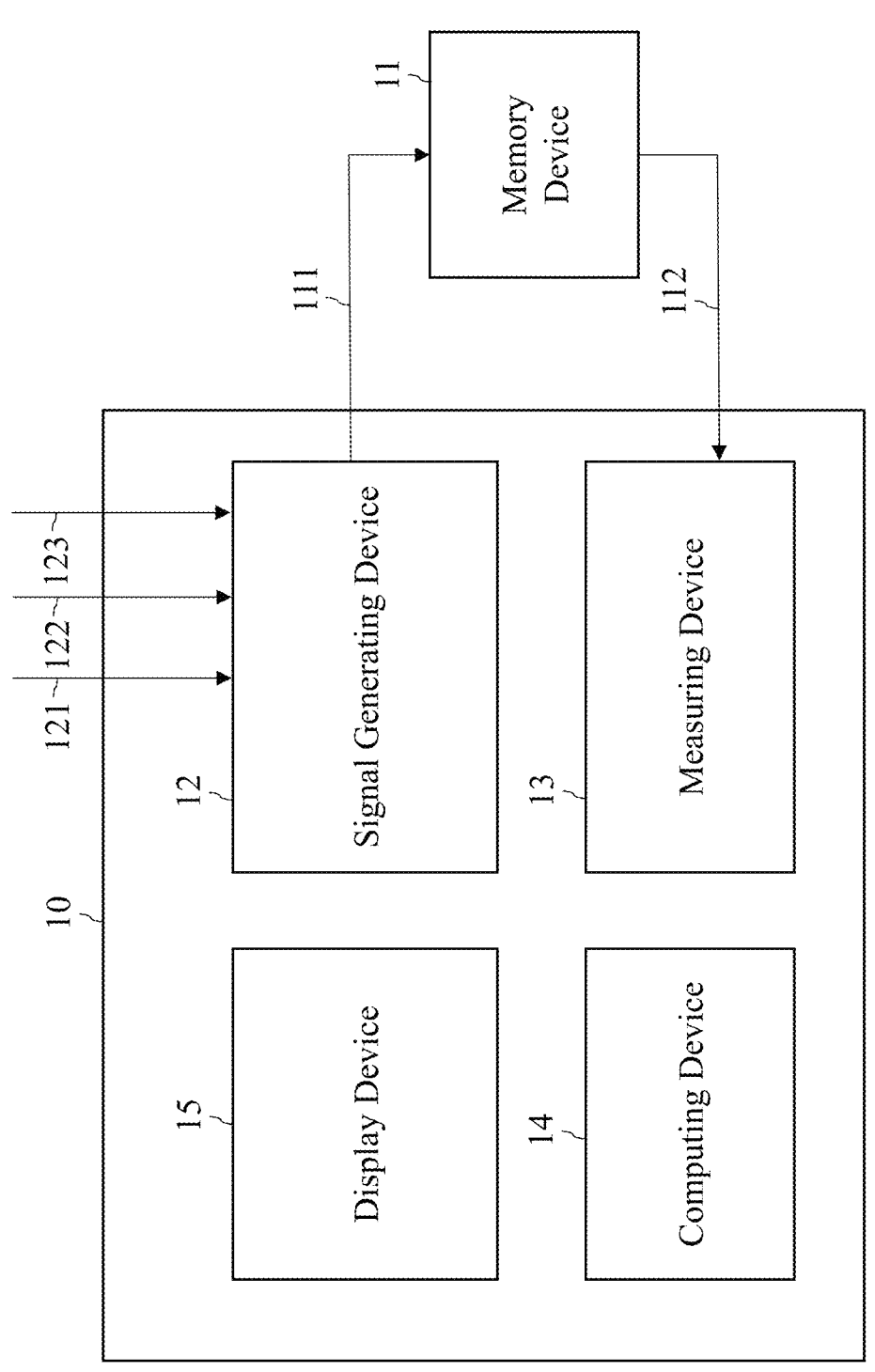
FIG. 1 is a block diagram of a system for testing a memory device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (for example, rotated 90° or at other orientations) and the spatially relative descriptors used herein interpreted accordingly. In addition, it will also be understood that when a layer is referred to as being "between" two layers, it can be the only layer between the two layers, or one or more intervening layers may also be present.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," another element, there are no intervening elements or layers present. Other words used to describe the relationship between elements or layers should be interpreted in a like fashion (e.g., "between," versus "directly between," "adjacent," versus "directly adjacent," etc.).

A DLL (delay lock loop) can be used to maintain a fixed timing relationship between signals in environments where variations in process, voltage, clock rate, or temperature may cause such relationship to change over time. A DLL can continuously compare the relationship between two signals and provide feedback for adjusting and maintaining a fixed relationship therebetween.

Locking time refers to a time interval required by a DLL to achieve a stable locking state from an initial state. Generally, locking time relates to the speed of the phase detector in the DLL, the magnitude of the charging or discharging current, and the overall delay loop bandwidth.

FIG. 1 is a block diagram of a system 10 for testing a memory device in accordance with some embodiments of the present disclosure.

In some embodiments, system 10 is configured to determine a target locking time for a DLL of a memory device 11. The memory device 11 may be tested after fabrication, and shipped thereafter.

In some embodiments, the system 10 may include hardware and software components that provide a suitable operational and functional environment for testing. In some embodiments, the system may include a signal generating device 12, a measuring device 13, a computing device 14, and a display device 15.

In some embodiments, signals, data, commands, and/or instructions can be transmitted between one or more of the signal generating device 12, the measuring device 13, the computing device 14, and the display device 15. Additionally, signals, data, commands, and/or instructions (signals 111 and 112) can be transmitted between system 10 and memory device 11.

The signal generating device 12 can be configured to provide input signals 111 to the memory device 11. In some embodiments, the signal generating device 12 is configured to provide a first set of input signals 111 to the memory device 11 in accordance with a first set of first operational parameters 121 and a set of second operational parameters 122. In some embodiments, the signal generating device 12 is configured to provide a second set of input signals 111 to the memory device 11 in accordance with a second set of first operational parameters 121 and a set of third operational parameters 123.

According to FIG. 1, the system 10 is configured to determine a target locking time for a DLL of a memory device 11. The memory device 11 may be tested after fabrication, and shipped thereafter.

In some embodiments, the system 10 may include hardware and software components that provide a suitable operational and functional environment for testing. In some embodiments, the system 10 may include a signal generating device 12, a measuring device 13, a computing device 14, and a display device 15.

Signals, data, commands, and/or instructions may be transmitted between one or more of the signal generating device 12, the measuring device 13, the computing device 14, and the display device 15. Signals, data, commands, and/or instructions may be transmitted between the system and the memory device 11.

The signal generating device 12 can be configured to provide input signals 111 to the memory device 11. In some embodiments, the signal generating device 12 is configured to provide a first set of input signals 111 to the memory device 11 according to a first set of first operational parameters 121 and a set of second operational parameters 122. In some embodiments, the signal generating device 12 is configured to provide a second set of input signals 111 to the memory device 11 according to a second set of first operational parameters 121 and a set of third operational parameters 123.

In some embodiments, the first operational parameters 121, the second operational parameters 122, or the third operational parameters 123 may be input to the system 10 as illustrated in FIG. 1. These operational parameters may be provided by either the manufacturer or the user of the memory device 11. A minimum value, maximum value, and step value for these operational parameters can be input, enabling the signal generating device 12 to automatically generate the desired operational parameters accordingly. Alternatively, these operational parameters may be pre-stored in the signal generating device 12. The first operational parameters 121 are associated with the locking times (tDLLK) of the memory device 11. The second operational parameters 122 pertain to the clock periods (tCK) of the memory device 11. The third operational parameters 123 relate to the supply voltages (VDD) of the memory device 11. The number of parameters within the set of third operational parameters 123 may differ from the number of parameters within the set of second operational parameters 122.

In some embodiments, the measuring device 13 may be configured to receive output signals 112 from the memory device 11. In some embodiments, the measuring device 13 is configured to receive and measure a first set of output signals 112 from the memory device 11 in response to the first set of input signals 111. In some embodiments, the measuring device 13 and the computing device 14 may be configured to determine whether the DLL fails at any combination of the first set of first operational parameters 121 and the set of second operational parameters 122. In some embodiments, the measuring device 13 is configured to receive and measure a second set of output signals 112 from the memory device 11 in response to the second set of input signals 111, and to determine, with the assistance of the computing device 14, whether the DLL fails at any combination of the second set of first operational parameters 121 and the set of third operational parameters 123. In some embodiments, the first set of input signals 111 are data strobe (DQS) signals of the memory device 11. In some embodiments, the determination of whether the DLL fails is based on the stability of the DQS signals.

In some embodiments, the computing device 14 is configured to determine a first candidate operational parameter from the first set of first operational parameters 121, under which the DLL does not fail for each of the set of second operational parameters 122, and to subsequently determine the target locking time based on the first candidate operational parameter. In some embodiments, the computing device 14 is further configured to determine a second candidate operational parameter from the second set of first operational parameters 121, under which the DLL does not fail for each of the set of third operational parameters 123, and to determine the target locking time based on both the first candidate operational parameter and the second candidate operational parameter. In some embodiments, the computing device 14 compares the first candidate operational parameter and the second candidate operational parameter to determine the target locking time.

In some embodiments, the memory device 11 is a DDR SDRAM (double data rate synchronous dynamic random access memory), DDR2 SDRAM (double data rate second-generation synchronous dynamic random access memory), DDR3 SDRAM (double data rate third-generation synchronous dynamic random access memory), DDR4 SDRAM (double data rate fourth-generation synchronous dynamic random access memory), DDR5 SDRAM (double data rate fifth-generation synchronous dynamic random access memory), or DDR6 SDRAM (double data rate sixth-generation synchronous dynamic random access memory), but the present disclosure is not limited thereto.

In some embodiments, the display device 15 may be configured to show one or more two-dimensional plot regions comprising a plurality of plot units each corresponding to one combination of the first operational parameters 121 and the second operational parameters 122 or one combination of the first operational parameters 121 and the third operational parameters 123. In some embodiments, the one or more two-dimensional plot regions can help determine the candidate operational parameters.

Figure 2:
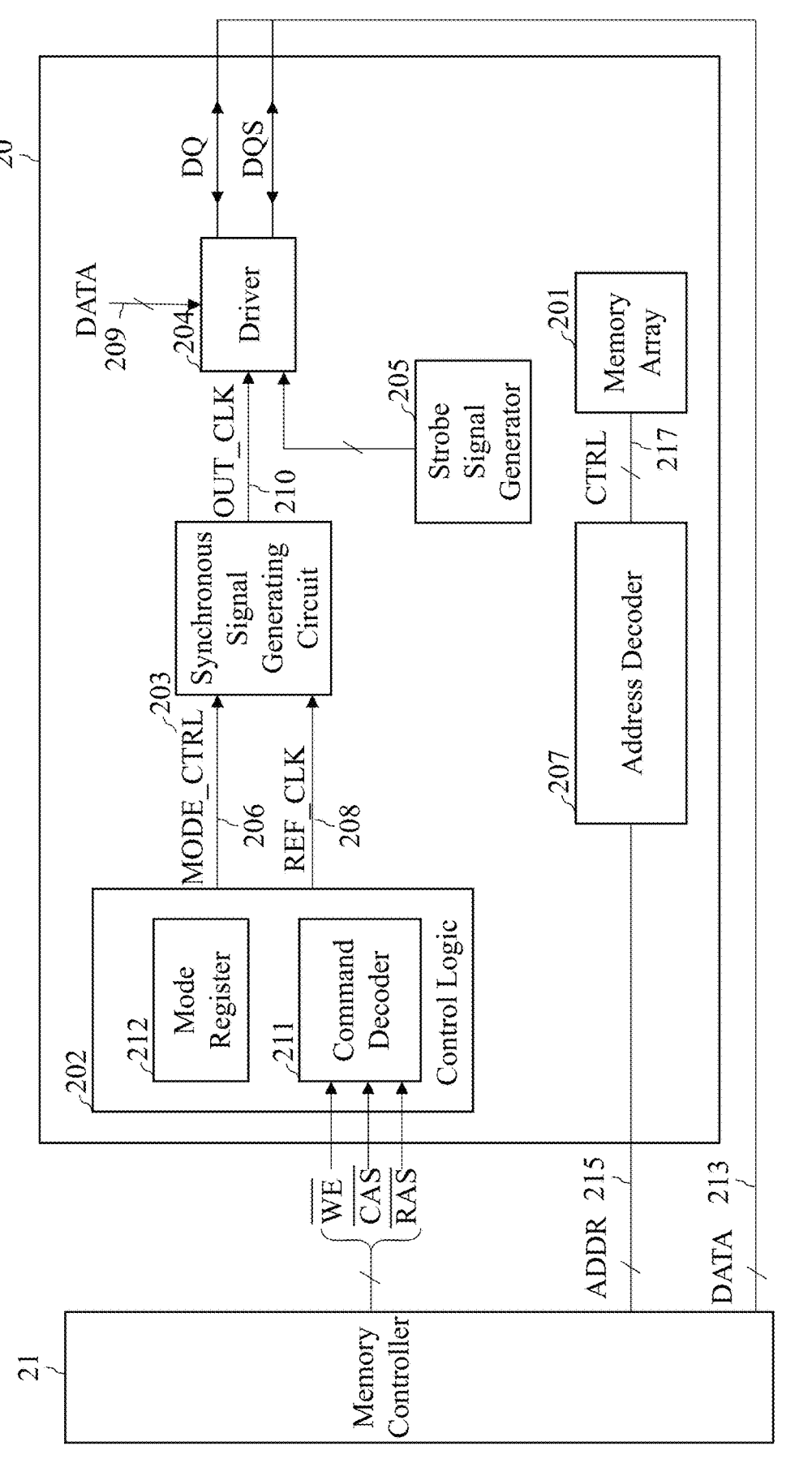
FIG. 2 is a block diagram of a memory device in accordance with some embodiments of the present disclosure.

FIG. 2 is a block diagram of a memory device in accordance with some embodiments of the present disclosure.

For brevity, FIG. 2 presents a simplified block diagram, in which only the elements relevant to the present disclosure are shown. It should be noted that the elements within the memory device 20 are not limited to those shown in FIG. 2. In some embodiments, memory device 20 can include a memory array 201, a control logic 202, a synchronous signal generating circuit 203, a driver 204, a strobe signal generator 205, and an address decoder 207.

In some embodiments, memory array is configured to store data. The memory controller 21 may send address signals to the address decoder 207 over address bus 215 (ADDR) connected therebetween. The address decoder 207 may include an address decode logic, a bank control logic, and corresponding logic circuits. The address decoder 207 may decode the received address signal and apply a plurality of control signals 217 (CTRL) to memory array 20-1 according to the decoded addresses.

In some embodiments, control logic 202 is configured to control read and write operations of memory array 201. Control logic 202 may include a command decoder 211 and a mode register 212. Command decoder 211 is configured to decode a plurality of signals received from a memory controller 21. The signals include at least a Write Enable (/WE), a Column Address Strobe (/CAS) and a Row Address Strobe (/RAS) as shown. Control logic 202 may generate a plurality of mode control signals 206, such as signal MODE_CTRL shown in FIG. 2. Control logic 202 may store mode control signals (e.g., signal MODE_CTRL) in mode register 212 for controlling operations of memory device 20.

In some embodiments, the synchronous signal generating circuit 203 is configured to align rising/falling or leading/trailing edges of synchronous output signals with the input reference clock signal 208 (REF_CLK) to reduce skew between synchronous output signal and input reference clock signal 208 (REF_CLK). The synchronous signal generating circuit 203 further receives mode control signals 206 (MODE_CTRL) and operates according to mode control signals 206 (MODE_CTRL), the details of which are described as follows.

In some embodiments, the driver 204 is configured to drive data bits (DQ) and data strobe signal (DQS) based on synchronous output signal 210 (OUT_CLK) generated by the synchronous signal generating circuit 203. The driver 204 sequentially receives the data from a multiplexer (not shown) via the data bus 209, a data strobe signal DQS from a strobe signal generator 205 and a synchronous output signal 210 (OUT_CLK) from the synchronous signal generating circuit 203. The data strobe signal DQS has the same frequency as the input reference clock signal 208 (REF_CLK) and is used by the memory controller 21 in latching data from the memory device 20 during read operations. In response to the synchronous output signal 210 (OUT_CLK), the driver 204 sequentially outputs the received data as corresponding data bits DQ in a DDR configuration, and also outputs the data strobe signal DQS.

In some embodiments, each data bit DQ and the data strobe signal DQS collectively define a data bus 213 coupled to the memory controller 21 which, during read operations, latches each bit on the data bus 213 responsive to the data strobe signal DQS. The driver 204 includes a latch (not shown), which uses the rising/falling or leading/trailing edges of synchronous output signal generated by the synchronous signal generating circuit 203 to latch data bits to the DQ signal and data strobe signal DQS to the strobe I/O signal. In this manner, the memory array 201 is operated based on synchronous output signal with little or no skew relative to the clock signal applied to the memory array 201.

In some embodiments, synchronous signal generating circuit 203 may include a delay locked loop (DLL) device, as follows.

Figure 3A:
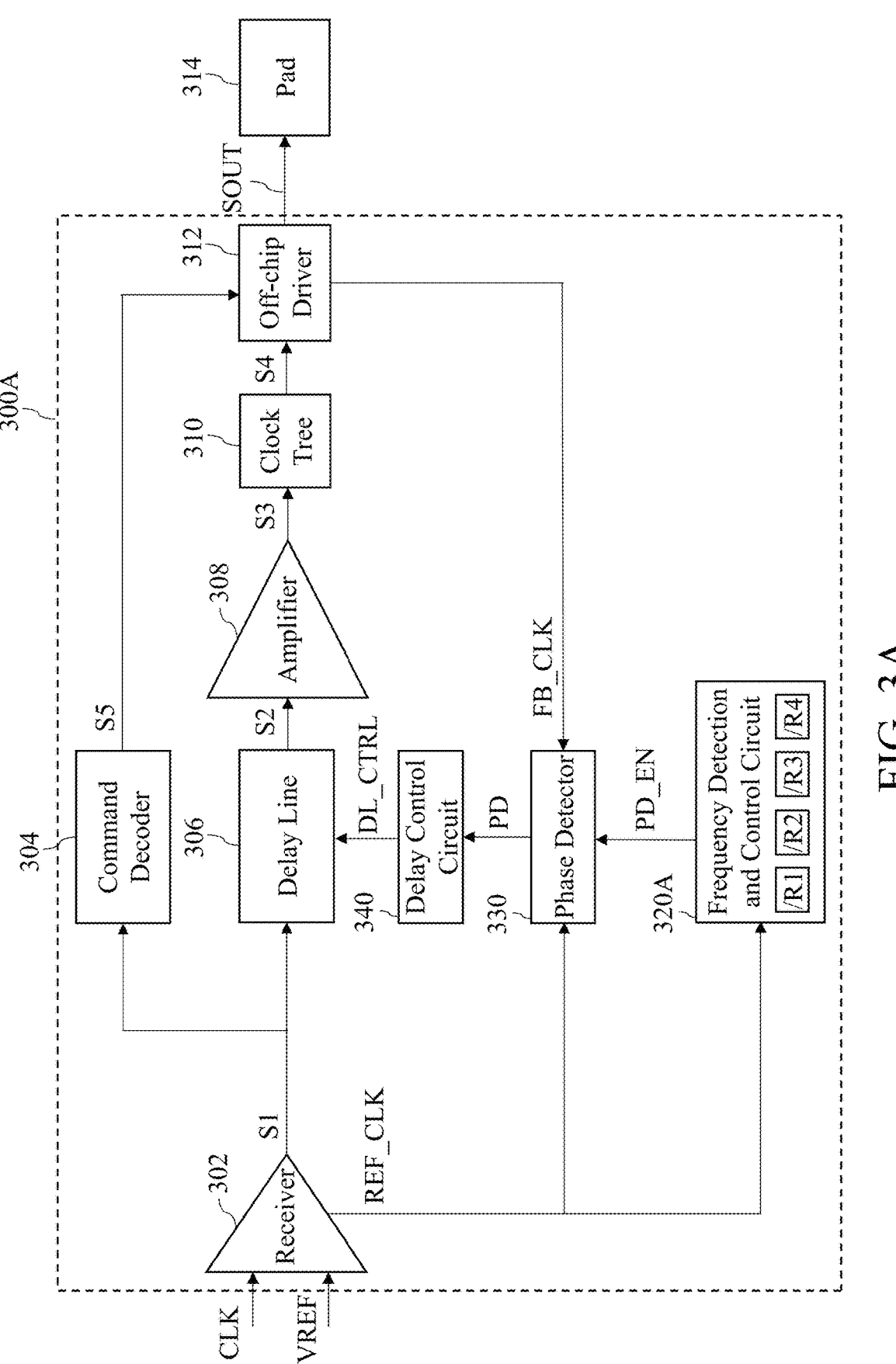
FIG. 3A is a block diagram of a delay locked loop device in accordance with some embodiments of the present disclosure.

FIG. 3A is a block diagram of a delay locked loop device in accordance with some embodiments of the present disclosure. FIGS. 4A-4D are waveform diagrams of various signals within the delay locked loop device in FIG. 3A.

In some embodiments, the delay locked loop (DLL) device 300A is configured to generate an output signal SOUT according to a clock signal CLK and provide the output signal SOUT to pad 314, which may constitute physical input/output pins of, for example, memory device

20 shown in FIG. 2. The delay locked loop (DLL) device 300A includes a receiver 302, a command decoder 304, a delay line 306, an amplifier 308, a clock tree 310, an off-chip driver (OCD) 312, a frequency detection and control circuit 320A, a phase detector 330, and a delay control circuit 340, as depicted in FIG. 3A.

In some embodiments, the receiver 302 is configured to receive an input clock signal CLK and a reference voltage VREF, and generate a signal S1 and a reference clock signal REF_CLK based on the input clock signal CLK. In some embodiments, the input clock signal CLK may be from external test equipment, such as the signal generating device 12 in system 10 shown in FIG. 1. In some embodiments, the waveforms of the signals and reference clock signals REF_CLK are substantially the same as the waveform of the input clock signal CLK. In some embodiments, the receiver 302 may be implemented using an operational amplifier, but the present disclosure is not limited thereto. The command decoder 304 is configured to receive signal S1 and a memory access command (not shown) from the memory controller (not shown), and generate a signal S5, such as a memory read command, or a memory write command and corresponding data signal DQ, based on the timing of signal S1.

In some embodiments, the delay line 306 may be a programmable delay line controlled by a control signal DL_CTRL from the delay control circuit 340. For example, the delay line 306 may adjust (e.g., increase or decrease) the delay of signal S1 to generate signal S2. Accordingly, the waveform of signal S2, which is delayed by a time interval controlled by the delay line 306, is similar to that of signal S1. The time interval can be referred to as a delay time (e.g., could be a positive or negative delay time) of the delay locked loop device 300A. For example, positive delay time indicates that signal S2 lags behind signal S1 by the delay time. Negative delay time indicates that signal S2 leads signal S1 by the delay time.

In some embodiments, the amplifier 308 is configured to amplify signal S2 to generate signal S3. The clock tree 310 is configured to perform calculations and generate signal S4 based on signal S3. In some embodiments, the waveform of signal S4 is substantially equal to that of signal S3 or an amplified version of signal S3. The off-chip driver (OCD) 312 is configured to generate an output signal SOUT based on signals S4 and S5. For example, the off-chip driver 312 may synchronize signal S5 (e.g., the memory access command and corresponding data signal DQ) with signal S4, which is a clock signal used by the off-chip driver 312, thereby providing the output signal SOUT to the pad 314. Additionally, the off-chip driver 312 is configured to provide a feedback clock signal FB_CLK to the phase detector 330. For example, the waveform of the feedback clock signal FB_CLK is substantially the same as that of signal S4.

In some embodiments, the frequency detection and control circuit 320A is configured to detect an operating frequency of the reference clock REF_CLK from the receiver 302, and generate an enable signal PD_EN for the phase detector 330 based on the detected operating frequency of the reference clock REF_CLK. For example, a DDR4 SDRAM may support operating frequencies ranging from 2100 MHz to 3600 MHz, with a plurality of operating frequencies utilized by the memory device 20 depicted in FIG. 2. For illustrative purposes, the reference clock REF_CLK for a DDR4 SDRAM, such as memory device 20, may include four operating frequencies: 2100 MHz, 2400 MHz, 3200 MHz, and 3600 MHz. However, the present disclosure is not limited thereto. The operating frequencies, as well as the number thereof, can be adjusted according to need.

In some embodiments, when the frequency detection and control circuit 320A detects that the operating frequency of reference clock signal REF_CLK is 2100 MHz, 2400 Mhz, 3200 MHz, and 3600 MHz, the frequency detection and control circuit 320A may assert the enable signal PD_EN for the phase detector 330 for one clock cycle of the reference clock signal REF_CLK per first cycle count R1, second cycle count R2, third cycle count R3, and fourth cycle count R4, respectively. In other words, when the frequency detection and control circuit 320A detects that the operating frequency of reference clock signal REF_CLK is 2100 MHz, 2400 Mhz, 3200 MHz, and 3600 MHz, the frequency detection and control circuit 320A can divide the frequency (or multiply the period) of the reference clock signal REF_CLK by the first cycle count R1, second cycle count R2, third cycle count R3, and fourth cycle count R4, respectively.

In some embodiments, for purposes of description, the first cycle count R1, second cycle count R2, third cycle count R3, and fourth cycle count R4 may be, but are not limited to, 5, 8, 10, and 12, respectively. It should be noted that the feedback clock signal FB_CLK may be a delayed version of the reference clock signal REF_CLK, and thus a delay or phase difference may exist between the reference clock signal REF_CLK and the feedback clock signal FB_CLK. Accordingly, the phase detector 330 may detect the delay or phase difference between the reference clock signal REF_CLK and the feedback clock signal FB_CLK when the enable signal PD_EN is in the high logic state (e.g., "1"), thereby generating a phase detection result PD, which is sent to the delay control circuit 340.

Figure 4A:
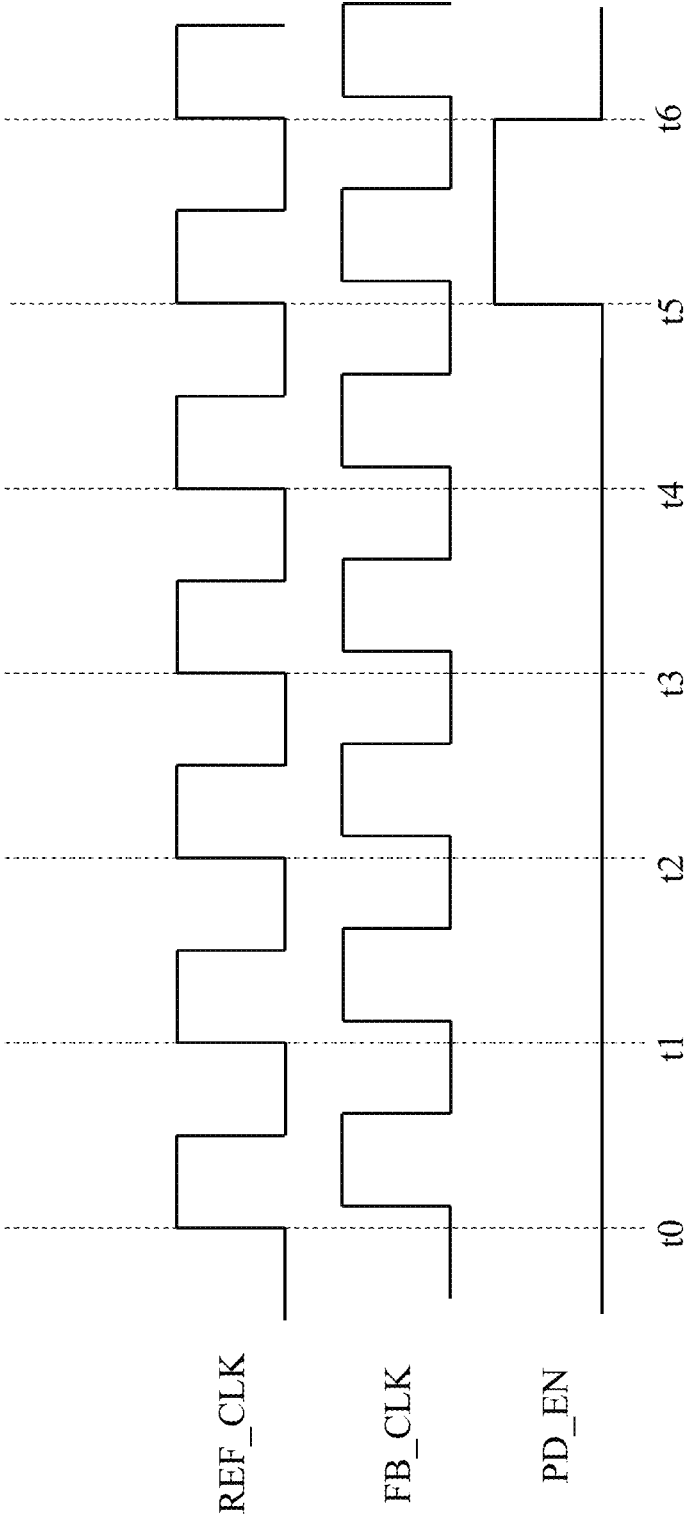
FIGS. 4A-4D are waveform diagrams of various signals within the delay locked loop device in FIG. 3A.
Figure 4B:
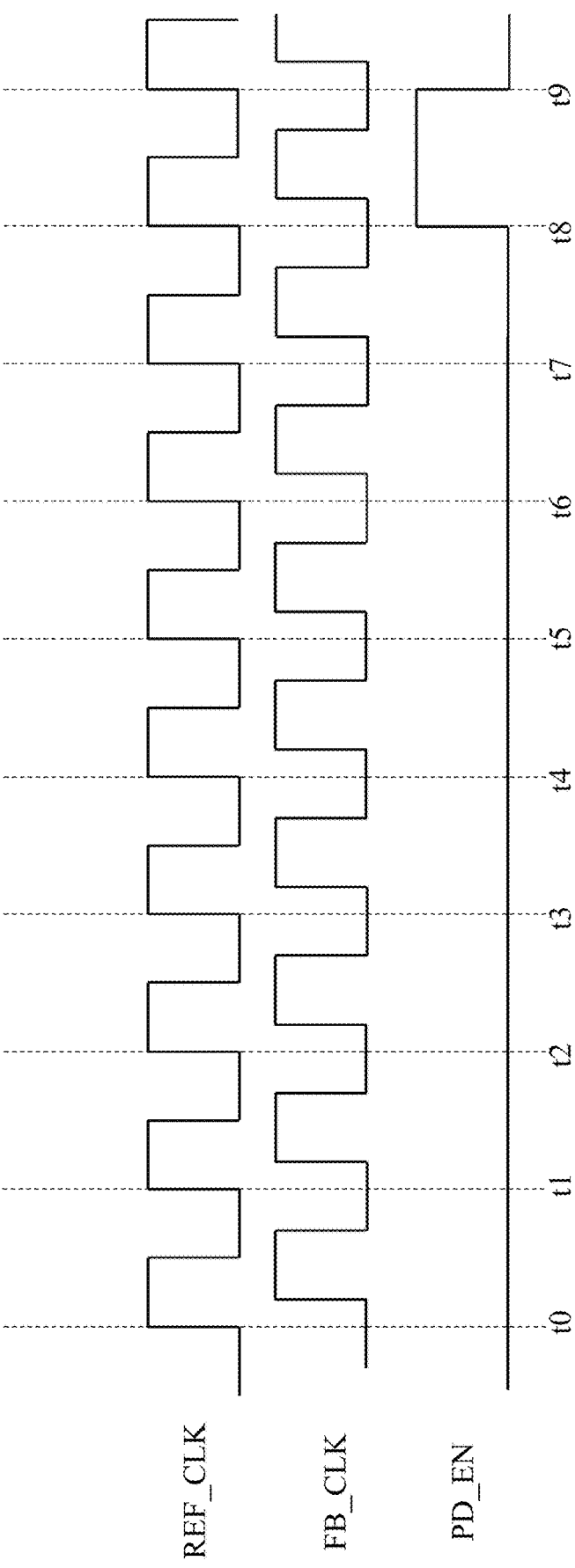
Figure 4C:
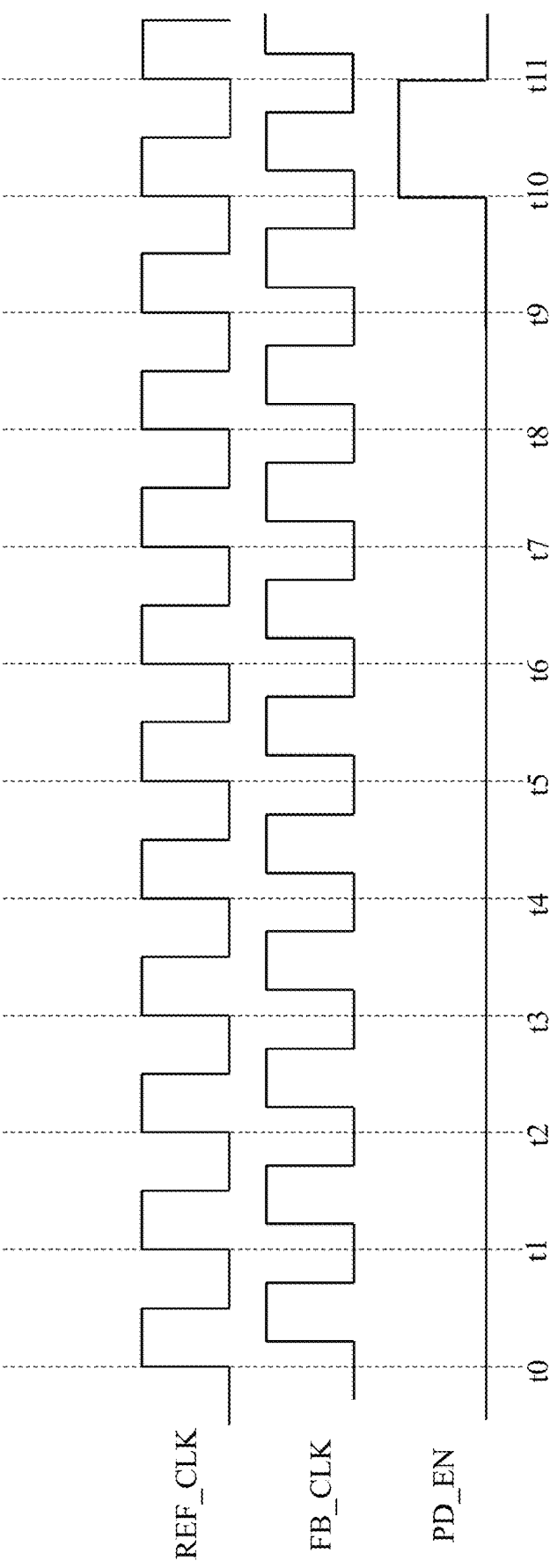
Figure 4D:
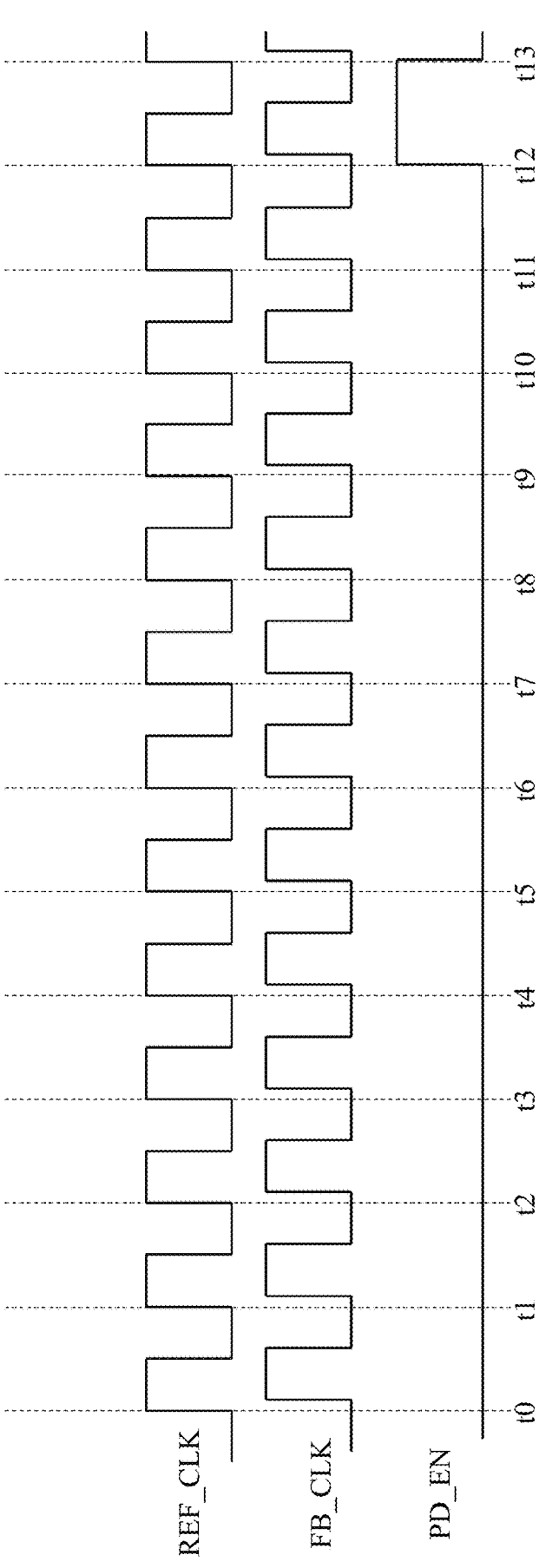

For example, upon detecting that the operating frequency of reference clock signal REF_CLK is 2100 MHz, the frequency detection and control circuit 320A may assert the enable signal PD_EN for one clock cycle every 5 clock cycles (e.g., times t0 to t5) of the reference clock signal REF_CLK, as depicted in FIG. 4A. Additionally, upon detecting that the operating frequency of reference clock signal REF_CLK is 2400 MHz, the frequency detection and control circuit 320A may assert the enable signal PD_EN for one clock cycle every 8 clock cycles (e.g., times t0 to t8) of the reference clock signal REF_CLK, as depicted in FIG. 4B. Moreover, upon detecting that the operating frequency of reference clock signal REF_CLK is 3200 MHz, the frequency detection and control circuit 320A may assert the enable signal PD_EN for one clock cycle every 10 clock cycles (e.g., times t0 to t10) of the reference clock signal REF_CLK, as depicted in FIG. 4C. Furthermore, upon detecting that the operating frequency of reference clock signal REF_CLK is 3600 MHz, the frequency detection and control circuit 320A may assert the enable signal PD_EN for one clock cycle every 12 clock cycles (e.g., times t0 to t12) of the reference clock signal REF_CLK, as depicted in FIG. 4D.

In some embodiments, the delay control circuit 340 may generate a delay control signal DL_CTRL for the delay line 306, thereby controlling the delay time of signal S1 to generate signal S2 based on the delay control signal DL_CTRL. Additionally, the delay control signal DL_CTRL could be between an upper limit and a lower limit, a positive threshold and a negative threshold, respectively.

For example, when the phase detector 330 detects that the feedback clock signal FB_CLK lags behind the reference clock signal REF_CLK by a delay time (e.g., positive phase difference), the phase detection result PD may be positive, resulting in the delay control circuit 340 generating the delay control signal DL_CTRL as a negative value, thereby decreasing the delay of the feedback clock signal FB_CLK to synchronize with the reference clock signal REF_CLK. Additionally, when the phase detector 330 detects that the feedback clock signal FB_CLK leads the reference clock signal REF_CLK by a delay time (e.g., negative phase difference), the phase detection result PD may be negative, resulting in the delay control circuit 340 generating the delay control signal DL_CTRL as a positive value, thereby increasing the delay of the feedback clock signal FB_CLK to synchronize with the reference clock signal REF_CLK.

In certain conventional methodologies, the frequency detection and control circuit 320A depicted in FIG. 3A is not utilized in the traditional delay locked loop (DLL) device. Instead, the phase detector within the DLL is activated at a fixed number of clock cycles to ascertain the phase difference between the reference clock signal from the external test equipment and the feedback clock signal generated by the DLL, without accounting for the operating frequency of the memory device. For instance, the phase detector is activated every 10 clock cycles at operating frequencies of 2100 MHz (clock period=985.2 ps) and 3200 MHz (clock period=612.6 ps) for a DDR4 SDRAM, indicating that the phase detector is activated every 9.85 ns and 6.12 ns, respectively, to detect the phase difference between the reference clock signal and the feedback clock signal. However, a period of 9.85 ns to activate the phase detector at an operating frequency of 2100 MHz is approximately 33% slower than a period of 6.12 ns to activate the phase detector at an operating frequency of 3200 MHz. Consequently, for the conventional DLL device, it becomes increasingly challenging for the delay line to elevate the frequency of the feedback clock signal at lower operating frequencies for a DDR4 SDRAM. These issues become more severe for a DDR5 SDRAM, which operates at significantly higher frequencies.

Accordingly, the delay locked loop device 300A shown in FIG. 3A is capable of dynamically adjusting the activation period of the phase detector 330 based on the operating frequency of the memory device, and is designed to detect the phase difference between the reference clock signal REF_CLK and the feedback clock signal FB_CLK. By doing so, the delay locked loop device 300A effectively mitigates latency jump issues that may arise from timing drifts in the delay-locked loop (DLL) caused by significant fluctuations in the external power supply voltage (VDD).

Figure 3B:
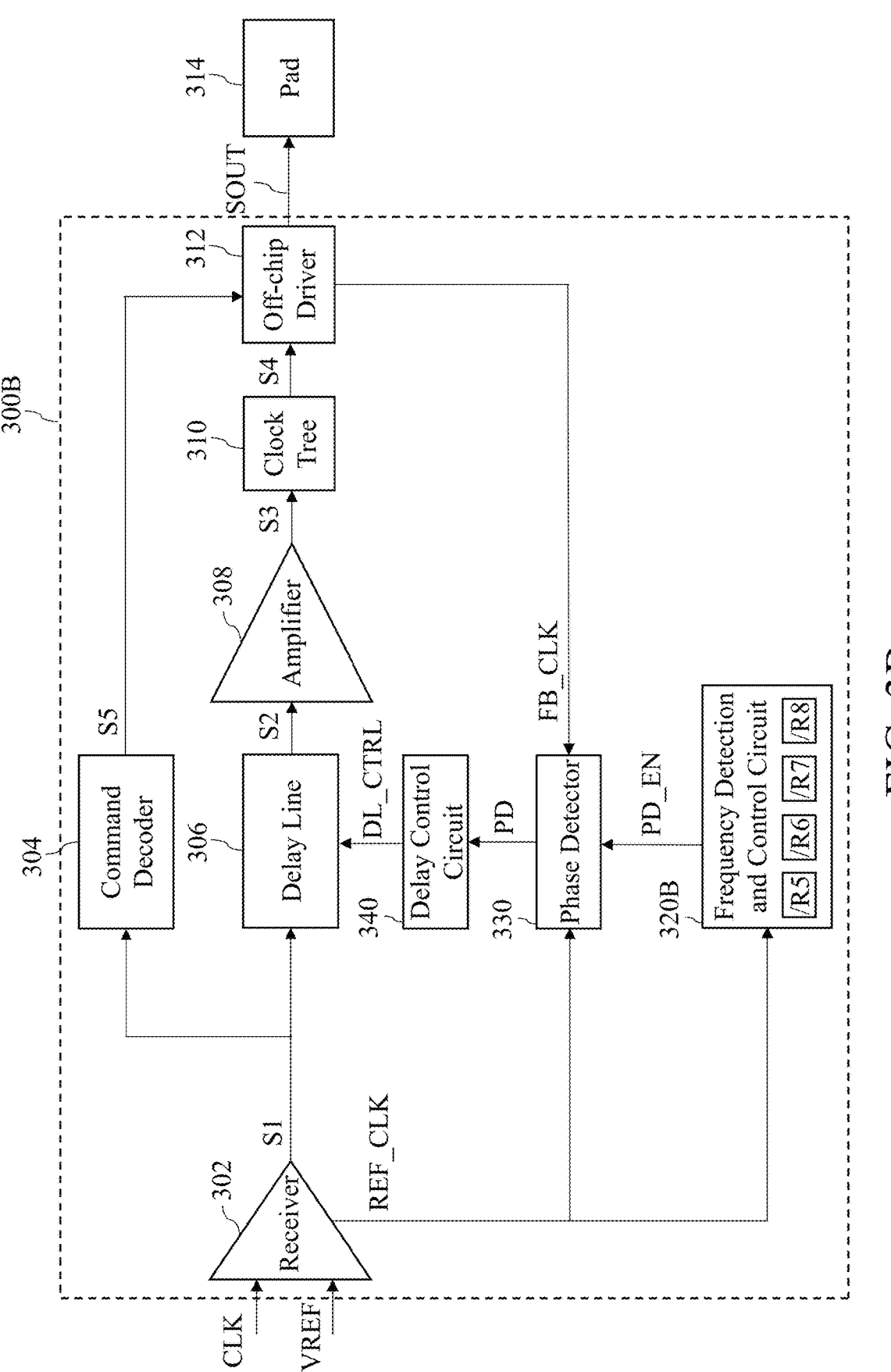
FIG. 3B is a block diagram of a delay locked loop device in accordance with still some embodiments of the present disclosure.

FIG. 3B is a block diagram of a delay locked loop device in accordance with still some embodiments of the present disclosure.

In some embodiments, the delay locked loop (DLL) device 300B shown in FIG. 3B may be similar to the delay locked loop device 300A, with the difference being that the delay locked loop device 300B is configured for a memory device, specifically a DDR5 SDRAM. For example, a DDR5 SDRAM can support significantly higher operating frequencies, such as between 4800 MHz and 7200 MHz, compared to a DDR4 SDRAM. For purposes of description, the reference clock REF_CLK for a DDR5 SDRAM, such as memory device 20, may include four operating frequencies, namely 4800 MHz, 5600 MHz, 6400 MHz, and 7200 MHz, although the present disclosure is not limited thereto. It should be noted that the operating frequencies, as well as the number thereof, can be adjusted according to need.

In some embodiments, the frequency detection and control circuit 320B in the delay locked loop device 300B shown in FIG. 3B is configured to detect the operating frequency of the reference clock signal REF_CLK for a DDR5 SDRAM, such as memory device 20, and generate an enable signal PD_EN for the phase detector 330 based on the detected operating frequency of the reference clock REF_CLK.

For example, upon detecting that the operating frequency of reference clock signal REF_CLK is 4800 MHz, 5600 Mhz, 6400 MHz, and 7200 MHz, the frequency detection and control circuit 320B may assert the enable signal PD_EN for the phase detector 330 for one clock cycle of the reference clock signal REF_CLK per fifth cycle count R5, sixth cycle count R6, seventh cycle count R7, and eighth cycle count R8, respectively. In other words, upon detecting that the operating frequency of reference clock signal REF_CLK is 4800 MHz, 5600 Mhz, 6400 MHz, and 7200 MHz, the frequency detection and control circuit 320B can divide the frequency (or multiply the period) of the reference clock signal REF_CLK by the fifth cycle count R5, sixth cycle count R6, seventh cycle count R7, and eighth cycle count R8, respectively.

In some embodiments, for purposes of description, the fifth cycle count R5, sixth cycle count R6, seventh cycle count R7, and eighth cycle count R8 may be, but are not limited to, 14, 18, 20, and 24, respectively. It should be noted that the feedback clock signal FB_CLK may be a delayed version of the reference clock signal REF_CLK, and thus a delay or phase difference may exist between the reference clock signal REF_CLK and the feedback clock signal FB_CLK. Accordingly, the phase detector 330 may detect the delay or phase difference between the reference clock signal REF_CLK and the feedback clock signal FB_CLK when the enable signal PD_EN is in the high logic state (e.g., "1"), thereby generating a phase detection result PD, which is sent to the delay control circuit 340.

It should be noted that the waveforms for the reference clock signal REF_CLK and feedback clock signal FB_CLK at 4800 MHz, 5600 MHz, 6400 MHz, and 7200 MHz, as well as the enable signal PD_EN, may be similar to those shown in FIGS. 4A to 4D, respectively, such that details thereof are not repeated here.

In some embodiments, the frequency detection and control circuit 320B shown in FIG. 3B can be incorporated into the frequency detection and control circuit 320A shown in FIG. 3A, indicating that the frequency detection and control circuit 320A is capable of detecting operating frequencies of the reference clock signal REF_CLK, which is compatible with DDR4 SDRAM and DDR5 SDRAM, and generate the enable signal PD_EN for the phase detector 330 based on the detection result of the operating frequency.

Figure 5A:
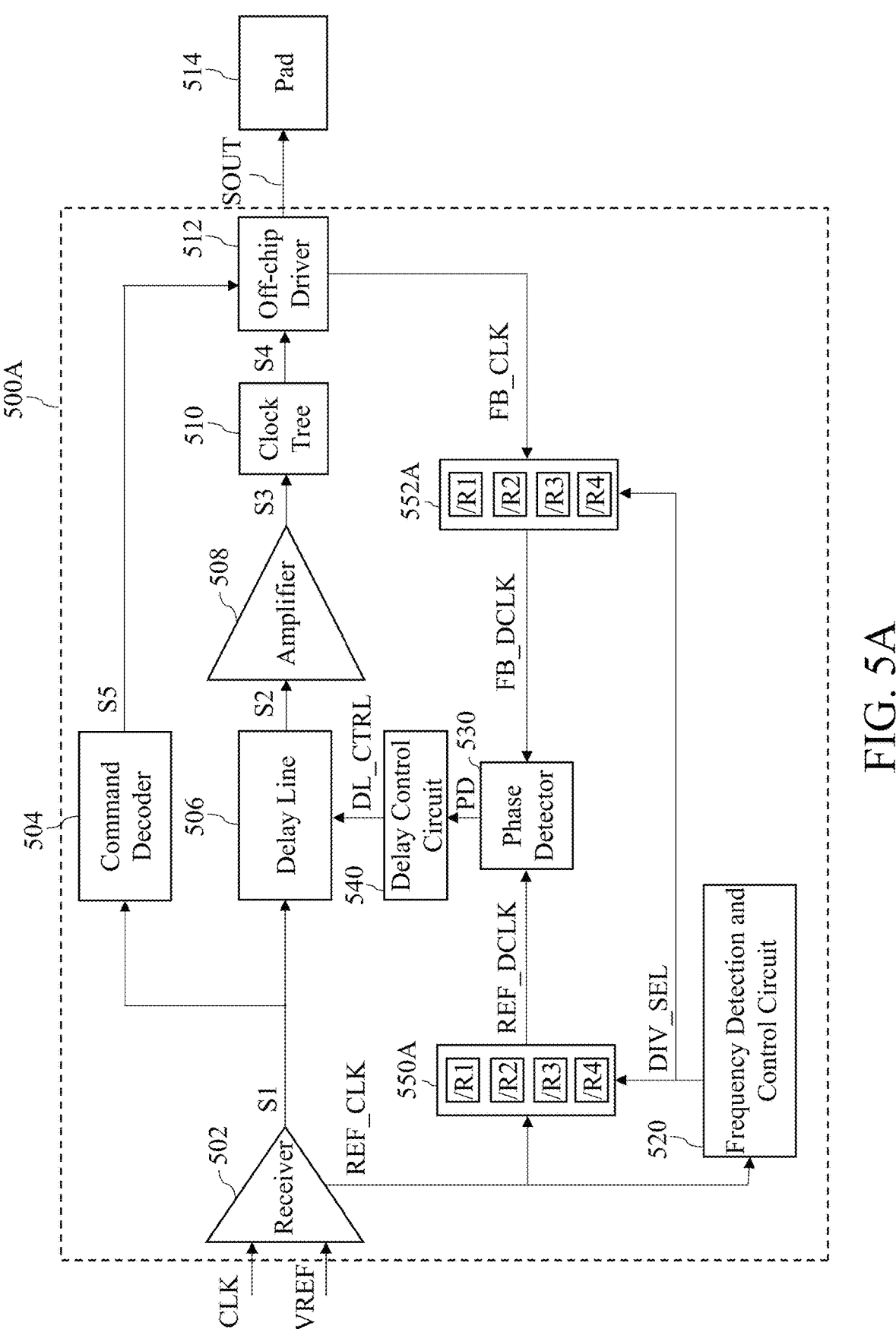
FIG. 5A is a block diagram of a delay locked loop device in accordance with some embodiments of the present disclosure.

FIG. 5A is a block diagram of a delay locked loop device in accordance with some embodiments of the present disclosure. FIGS. 6A-6D are waveform diagrams of various signals within the delay locked loop device in FIG. 5A.

In some embodiments, the delay locked loop device 500A is configured to generate an output signal SOUT according to a clock signal CLK and provide the output signal SOUT to pad 514, which may constitute physical input/output pins of, for example, memory device 20 shown in FIG. 2. The delay locked loop device 500A includes a receiver 502, a command decoder 504, a delay line 506, an amplifier 508, a clock tree 510, an off-chip driver (OCD) 512, a frequency detection and control circuit 520, a phase detector 530, a delay control circuit 540, and clock dividers 550A and 552A, as depicted in FIG. 5A.

In some embodiments, the receiver 502 is configured to receive an input clock signal CLK and a reference voltage VREF, and generate a signal S1 and a reference clock signal REF_CLK based on the input clock signal CLK. In some embodiments, the input clock signal CLK may be from external test equipment, such as the signal generating device 12 in system 10 shown in FIG. 1. In some embodiments, the waveforms of the signals and reference clock signals REF_CLK are substantially the same as the waveform of the input clock signal CLK. In some embodiments, the receiver 502 may be implemented using an operational amplifier, The command decoder 504 is configured to receive signal S1 and a memory access command and corresponding data signal DQ from a memory controller, such as the memory controller 21 shown in FIG. 2, and generate a signal S5, such as a memory read command, or a memory write command and corresponding data signal DQ, based on the timing of signal S1.

In some embodiments, the delay line 506 may be a programmable delay line controlled by a control signal DL_CTRL from the delay control circuit 540. For example, the delay line 506 may adjust (e.g., increase or decrease) the delay of signal S1 to generate signal S2. Accordingly, the waveform of signal S2, which is delayed by a time interval controlled by the delay line 506, is similar to that of signal S1. The time interval can be referred to as a delay time (e.g., could be a positive or negative delay time) of the delay locked loop device 500A. For example, when the delay time is positive, it indicates that signal S2 lags behind signal S1 by the delay time. When the delay time is negative, it indicates that signal S2 leads signal S1 by the delay time.

In some embodiments, the amplifier 508 is configured to amplify signal S2 to generate signal S3. The clock tree 510 is configured to perform calculations and generate signal S4 based on signal S3. In some embodiments, the waveform of signal S4 is substantially equal to that of signal S3 or an amplified version of signal S3. The off-chip driver (OCD) 512 is configured to generate an output signal SOUT based on signals S4 and S5. For example, the off-chip driver 512 may synchronize signal S5 (e.g., the memory access command and corresponding data signal) with signal S4, which is a clock signal used by the off-chip driver 512, thereby providing the output signal SOUT to the pad 514. Additionally, the off-chip driver 512 is configured to generate a feedback clock signal FB_CLK to the clock divider 552A from the signal S4. For example, the waveform of the feedback clock signal FB_CLK is substantially the same as that of signal S4.

In some embodiments, the frequency detection and control circuit 520 is configured to detect an operating frequency of the reference clock REF_CLK from the receiver 502, and generate a divider selection signal DIV_SEL for the clock dividers 550A and 552A based on the detected operating frequency of the reference clock REF_CLK. For example, a DDR4 SDRAM may support operating frequencies ranging from 2100 MHz to 3600 MHz, with a plurality of operating frequencies utilized by the memory device 20 depicted in FIG. 2. For illustrative purposes, the reference clock REF_CLK for a DDR4 SDRAM, such as memory device 20, may include four operating frequencies: 2100 MHz, 2400 MHz, 3200 MHz, and 3600 MHz. However, the present disclosure is not limited thereto. The operating frequencies, as well as the number thereof, can be adjusted according to need.

In some embodiments, when the frequency detection and control circuit 520 detects that the operating frequency of reference clock signal REF_CLK is 2100 MHz, 2400 Mhz, 3200 MHz, and 3600 MHz, the frequency detection and control circuit 520 may generate the divider selection signal DIV_SEL as a first value, a second value, a third value, and a fourth value, respectively. For purposes of description, the first value, second value, third value, and fourth value may be 2'b00, 2'b01, 2'b10, and 2'b11. The clock dividers 550A and 552A may generate a divided reference clock signal REF_DCLK and a divided feedback clock signal FB_DCLK from the reference clock signal REF_CLK and feedback clock signal FB_CLK based on the divider selection signal DIV_SEL from the frequency detection and control circuit 520, respectively.

Specifically, when the divider selection signal DIV_SEL is the first value, second value, third value, and fourth value, the clock dividers 550A and 552A divide the reference clock signal REF_CLK and the feedback clock signal FB_CLK by the first cycle count R1, second cycle count R2, third cycle count R3, and fourth cycle count R4, respectively.

In some embodiments, for purposes of description, the first cycle count R1, second cycle count R2, third cycle count R3, and fourth cycle count R4 may be, but are not limited to, 5, 8, 10, and 12, respectively. It should be noted that the feedback clock signal FB_CLK may be a delayed version of the reference clock signal REF_CLK, and thus a delay or phase difference may exist between the reference clock signal REF_CLK and the feedback clock signal FB_CLK. Additionally, the divided reference clock signal REF_DCLK is a divided version of the reference clock signal REF_CLK, while the divided feedback clock signal FB_DCLK is a divided version of the feedback clock signal FB_CLK. Furthermore, the clock divider 550A and 552A may output the divided reference clock signal REF_DCLK and the divided feedback clock signal FB_DCLK to the phase detector 530. Accordingly, the phase detector 530 may detect the delay or phase difference between the divided reference clock signal REF_DCLK and the divided feedback clock signal FB_DCLK per clock cycle of the divided reference clock signal REF_DCLK, thereby generating a phase detection result PD, which is sent to the delay control circuit 540.

Figure 6A:
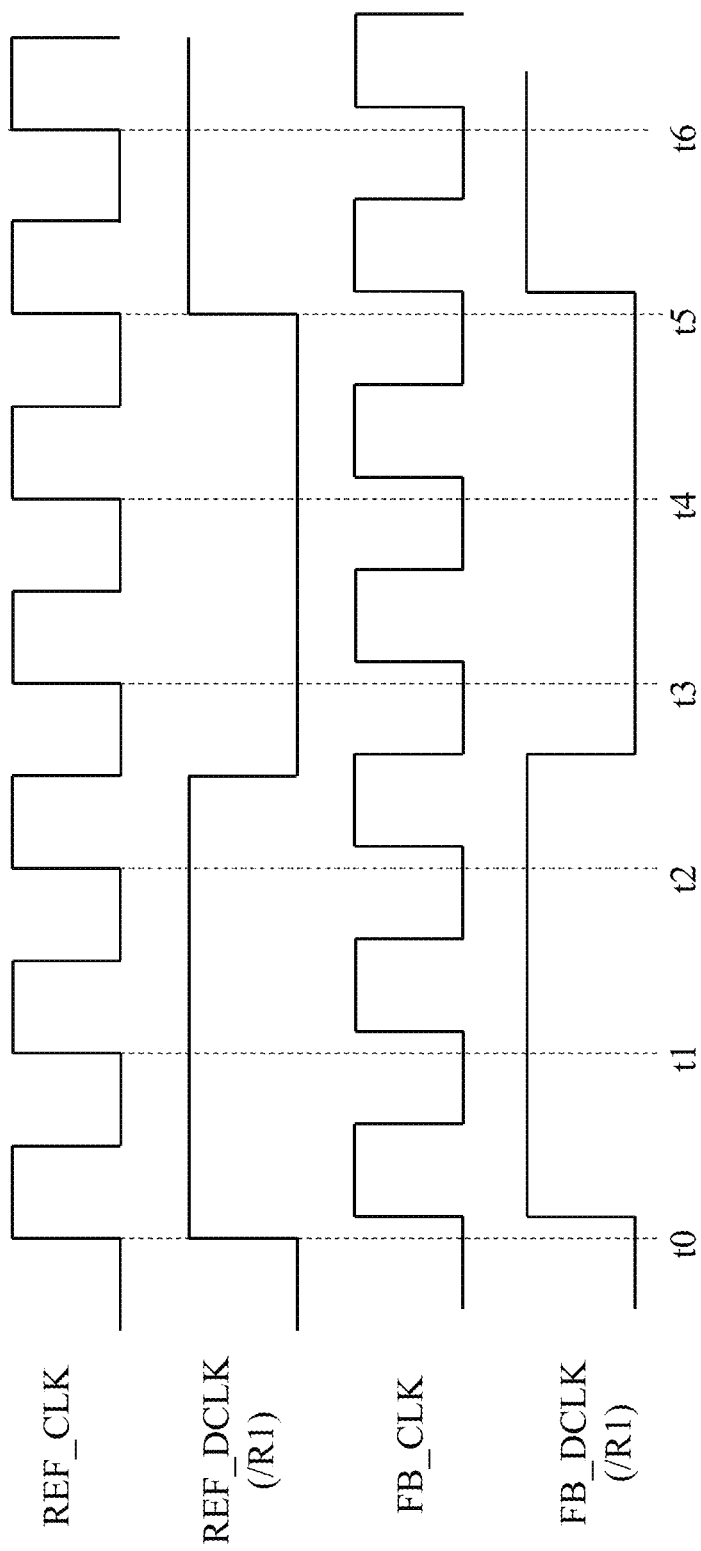
FIGS. 6A-6D are waveform diagrams of various signals within the delay locked loop device in FIG. 5A.

In some embodiments, upon detecting that the operating frequency of reference clock signal REF_CLK is 2100 MHz, the frequency detection and control circuit 520 generates the divider selection signal DIV_SEL with a value of 2'b00. Accordingly, the clock divider 550A, in response to the divider selection signal DIV_SEL set to 2'b00, outputs the divided reference clock signal REF_DCLK with a clock cycle (e.g., from times t0 to t5) 5 times longer than that of the reference clock signal REF_CLK, as depicted in FIG. 6A. Similarly, the clock divider 552A, also in response to the divider selection signal DIV_SEL set to 2'b00, outputs the divided feedback clock signal FB_DCLK with a clock cycle that is 5 times longer than that of the feedback clock signal FB_CLK, as depicted in FIG. 6A.

Figure 6B:
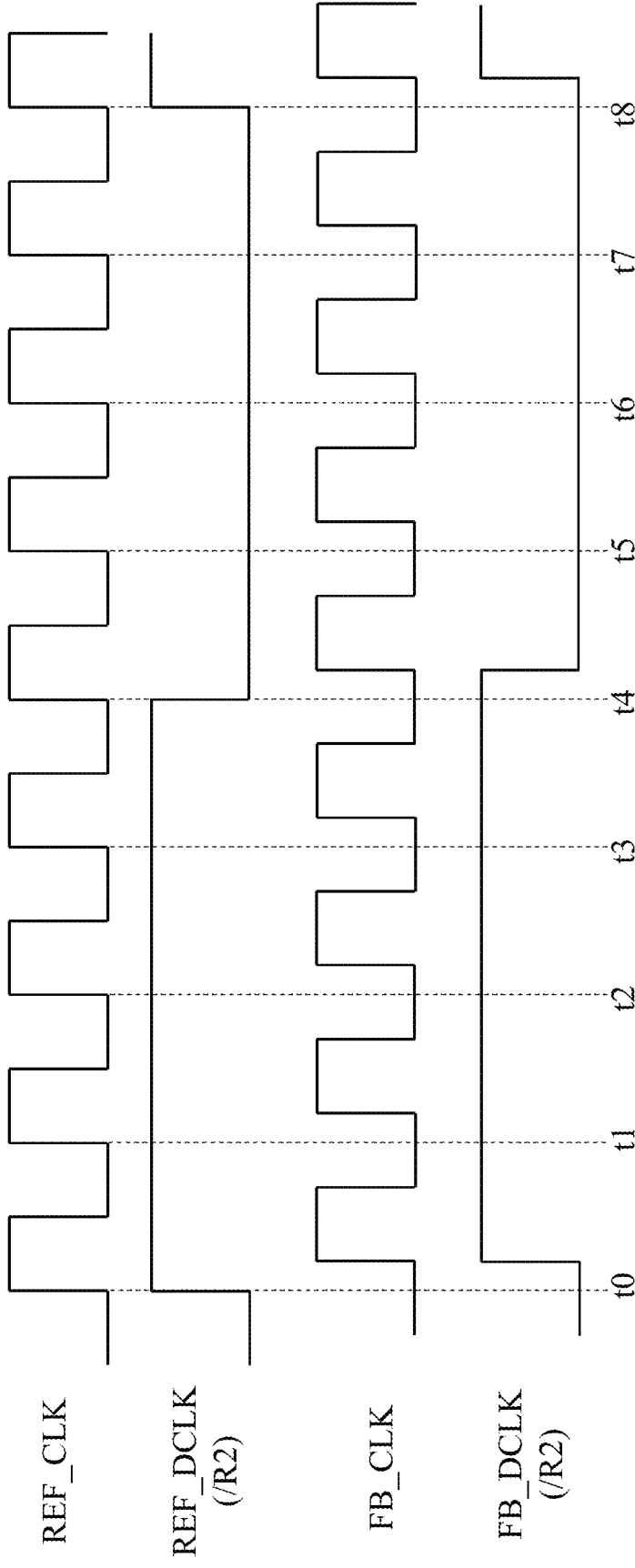

Additionally, upon detecting that the operating frequency of reference clock signal REF_CLK is 2400 MHz, the frequency detection and control circuit 520 generates the divider selection signal DIV_SEL with a value of 2'b01. Accordingly, the clock divider 550A, in response to the divider selection signal DIV_SEL set to 2'b01, outputs the divided reference clock signal REF_DCLK with a clock cycle (e.g., from times t0 to t8) 8 times longer than that of the reference clock signal REF_CLK, as depicted in FIG. 6B. Similarly, the clock divider 552A, also in response to the divider selection signal DIV_SEL set to 2'b01, outputs the divided feedback clock signal FB_DCLK with a clock cycle 8 times longer than that of the feedback clock signal FB_CLK, as depicted in FIG. 6B.

Figure 6C:
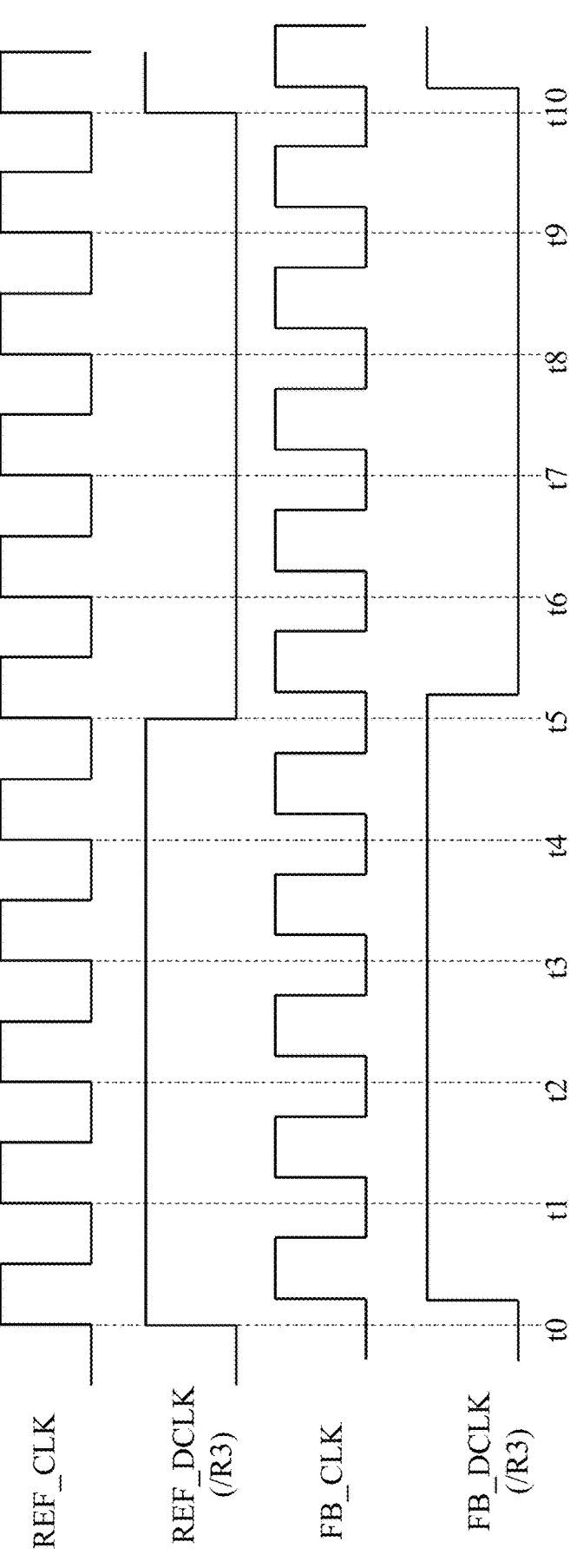

Moreover, upon detecting that the operating frequency of reference clock signal REF_CLK is 3200 MHz, the frequency detection and control circuit 520 generates the divider selection signal DIV_SEL with a value of 2'b10. Accordingly, the clock divider 550A, in response to the divider selection signal DIV_SEL set to 2'b10, outputs the divided reference clock signal REF_DCLK with a clock cycle (e.g., from times t0 to t10) 10 times longer than that of the reference clock signal REF_CLK, as depicted in FIG. 6C. Similarly, the clock divider 552A, also in response to the divider selection signal DIV_SEL set to 2'b10, outputs the divided feedback clock signal FB_DCLK with a clock cycle 10 times longer than that of the feedback clock signal FB_CLK, as depicted in FIG. 6C.

Figure 6D:
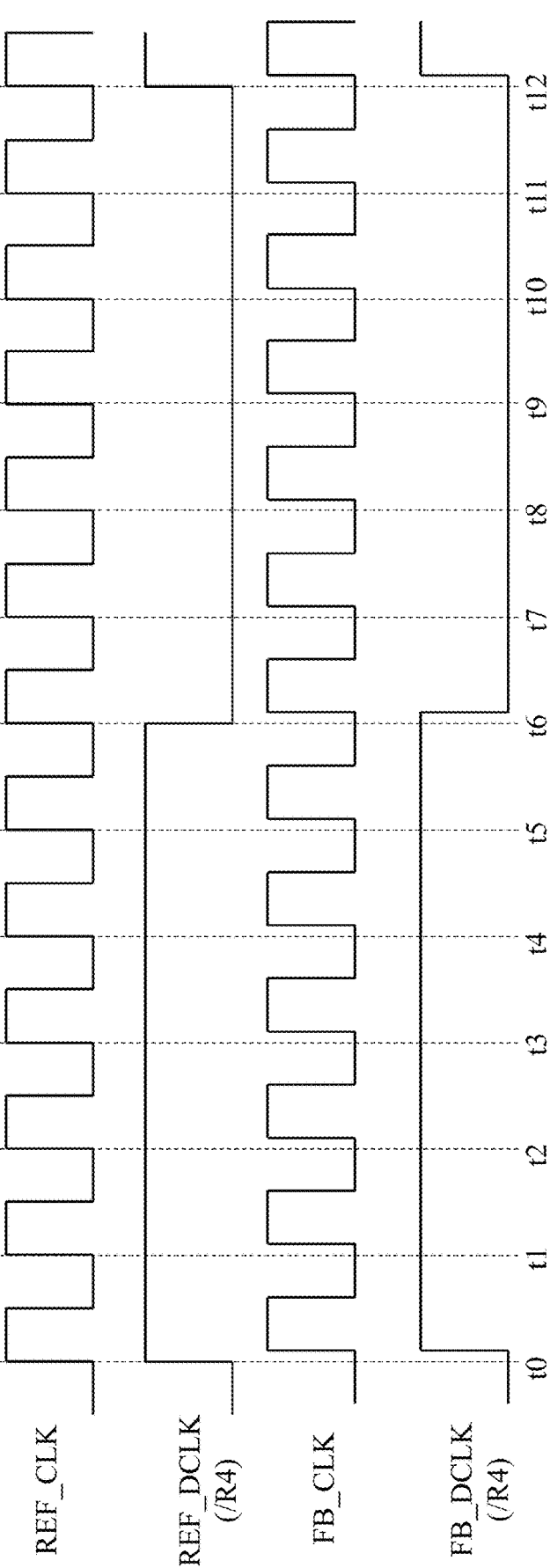

Furthermore, upon detecting that the operating frequency of reference clock signal REF_CLK is 3600 MHz, the frequency detection and control circuit 520 generates the divider selection signal DIV_SEL with a value of 2'b11. Accordingly, the clock divider 550A, in response to the divider selection signal DIV_SEL set to 2'b11, outputs the divided reference clock signal REF_DCLK with a clock cycle (e.g., from times t0 to t12) 12 times longer than that of the reference clock signal REF_CLK, as depicted in FIG. 6D. Similarly, the clock divider 552A, also in response to the divider selection signal DIV_SEL set to 2'b11, outputs the divided feedback clock signal FB_DCLK with a clock cycle 12 times longer than that of the feedback clock signal FB_CLK, as depicted in FIG. 6D.

In some embodiments, the delay control circuit 540 may generate a delay control signal DL_CTRL for the delay line 506, thereby controlling the delay time of signal S1 to generate signal S2 based on the delay control signal DL_CTRL. Additionally, the delay control signal DL_CTRL could be between an upper limit and a lower limit, a positive threshold and a negative threshold, respectively.

For example, when the phase detector 530 detects that the divided feedback clock signal FB_DCLK lags behind the divided reference clock signal REF_DCLK by a delay time, the phase detection result PD may be positive, resulting in the delay control circuit 540 generating the delay control signal DL_CTRL as a negative value, thereby decreasing the delay of the feedback clock signal FB_CLK to synchronize with the reference clock signal REF_CLK. Additionally, when the phase detector 330 detects that the divided feedback clock signal FB_DCLK leads the divided reference clock signal REF_DCLK by a delay time, the phase detection result PD may be negative, resulting in the delay control circuit 340 generating the delay control signal DL_CTRL as a positive value, thereby increasing the delay of the feedback clock signal FB_CLK to synchronize with the reference clock signal REF_CLK.

Accordingly, the delay locked loop device 500A shown in FIG. 5A is capable of dynamically adjusting the period of the phase detector 530 for detecting the phase difference between the divided reference clock signal REF_DCLK and the divided feedback clock signal FB_DCLK based on the detected operating frequency of the memory device. Thus, the delay locked loop device 500A effectively mitigates latency jump issues that may arise from timing drifts in the delay-locked loop (DLL) caused by significant fluctuations in the external power supply voltage (VDD).

Figure 5B:
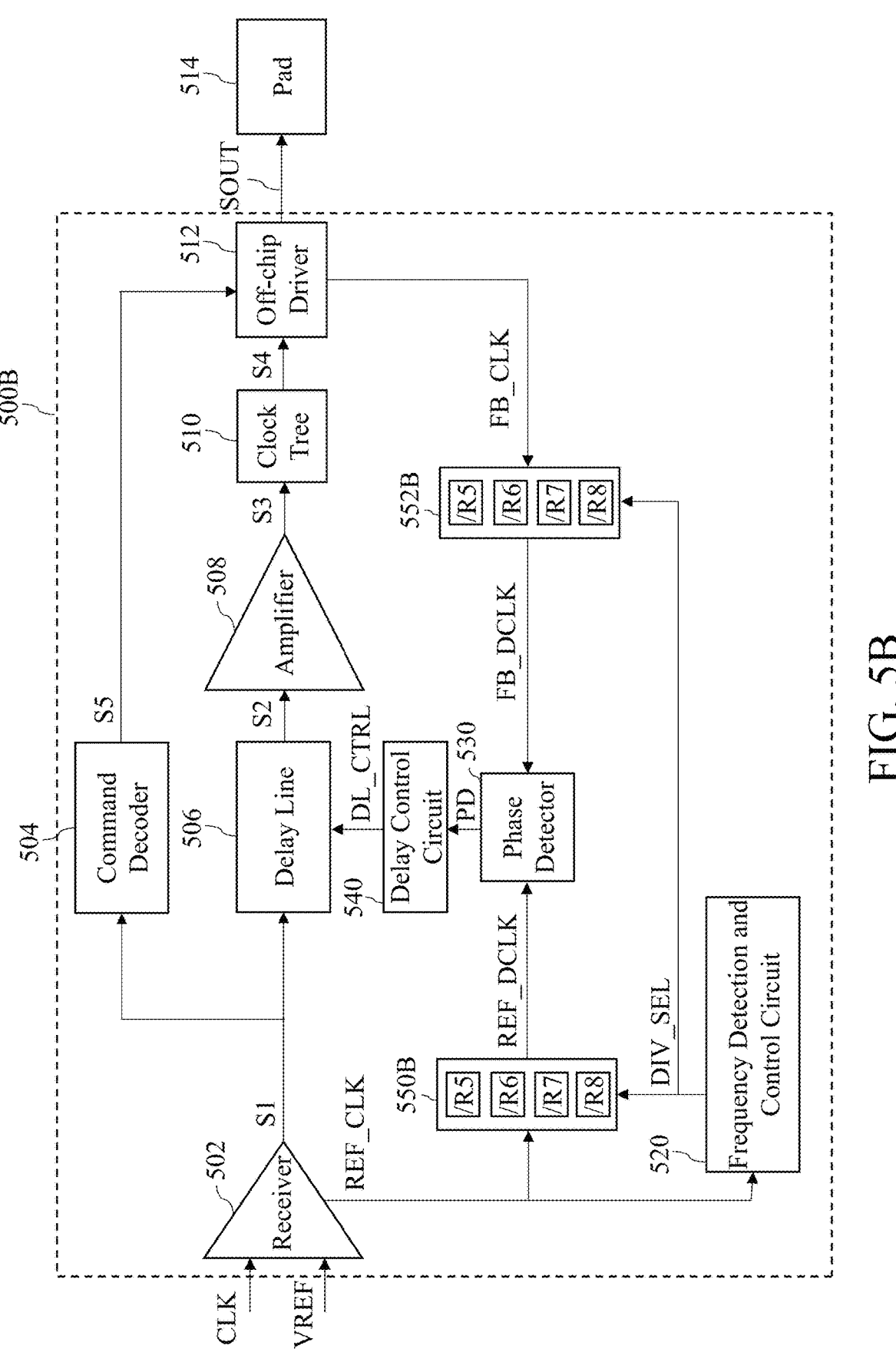
FIG. 5B is a block diagram of a delay locked loop device in accordance with still some embodiments of the present disclosure.

FIG. 5B is a block diagram of a delay locked loop device in accordance with still some embodiments of the present disclosure.

In some embodiments, the delay locked loop (DLL) device 500B shown in FIG. 5B may be similar to the delay locked loop device 500A, with the difference being that the delay locked loop device 500B is configured for a memory device, specifically a DDR5 SDRAM. For example, a DDR5 SDRAM can support significantly higher operating frequencies, such as between 4800 MHz and 7200 MHz, compared to a DDR4 SDRAM. For purposes of description, the reference clock REF_CLK for a DDR5 SDRAM, such as memory device 20, may include four operating frequencies, namely 4800 MHz, 5600 MHz, 6400 MHz, and 7200 MHz, although the present disclosure is not limited thereto. It should be noted that the operating frequencies, as well as the number thereof, can be adjusted according to need.

In some embodiments, the frequency detection and control circuit 520 in the delay locked loop device 500B shown in FIG. 5B is configured to detect the operating frequency of the reference clock signal REF_CLK for a DDR5 SDRAM, such as memory device 20, and generate a divider selection signal DIV_SEL for the clock dividers 550B and 552B based on the detected operating frequency of the reference clock REF_CLK.

For example, upon detecting that the operating frequency of reference clock signal REF_CLK is 4800 MHz, 5600 Mhz, 6400 MHz, and 7200 MHz, the frequency detection and control circuit 520 may generate the divider selection signal DIV_SEL with a value of 2'b00, 2'b01, 2'b10, and 2'b11, allowing the clock dividers 550B and 550A to output the divided reference clock signal REF_DCLK and divided feedback clock signal FB_DCLK by dividing the reference clock signal REF_CLK and feedback clock signal FB_CLK by the fifth cycle count R5, sixth cycle count R6, seventh cycle count R7, and eighth cycle count R8, respectively.

In some embodiments, for purposes of description, the fifth cycle count R5, sixth cycle count R6, seventh cycle count R7, and eighth cycle count R8 may be, but are not limited to, 14, 18, 20, and 24, respectively. It should be noted that the feedback clock signal FB_CLK may be a delayed version of the reference clock signal REF_CLK, and thus a delay or phase difference may exist between the reference clock signal REF_CLK and the feedback clock signal FB_CLK. Additionally, the divided reference clock signal REF_DCLK is a divided version of the reference clock signal REF_CLK, while the divided feedback clock signal FB_DCLK is a divided version of the feedback clock signal FB_CLK. Accordingly, the phase detector 530 may detect the delay or phase difference between the divided reference clock signal REF_DCLK and the divided feedback clock signal FB_DCLK per clock cycle of the divided reference clock signal REF_DCLK, thereby generating a phase detection result PD, which is sent to the delay control circuit 540.

It should be noted that the waveforms for the reference clock signal REF_CLK and feedback clock signal FB_CLK at 4800 MHz, 5600 MHz, 6400 MHz, and 7200 MHz, as well as the enable signal PD_EN, may be similar to those shown in FIGS. 6A to 6D, respectively, such that details thereof are not repeated here.

In some embodiments, the frequency detection and control circuit 520 shown in FIG. 5A is capable of detecting operating frequencies of the reference clock signal REF_CLK, which is compatible with both DDR4 SDRAM and DDR5 SDRAM, and generating the divider selection signal DIV_SEL for the clock dividers 550A and 552A based on the detection result of the operating frequency. Additionally, the clock dividers 550B and 552B shown in FIG. 5B can also be integrated into the clock dividers 550A and 552A shown in FIG. 5A, respectively. The integration indicates that the clock dividers 550A and 552A are capable of outputting the divided reference clock signal REF_DCLK and divided feedback clock signal FB_DCLK by dividing the reference clock signal REF_CLK and feedback clock signal FB_CLK by a particular cycle count based on the divider selection signal DIV_SEL, respectively. Accordingly, the phase detector 530 can determine the phase difference between the divided reference clock signal REF_DCLK and divided feedback clock signal FB_DCLK to generate the phase detection result PD.

In some embodiments, when the delay locked loop device 500A shown in FIG. 5A supports 8 operating frequencies and 8 cycle counts to encompass the DDR4 SDRAM and DDR5 SDRAM, the divider selection signal generated by the frequency detection and control circuit 520 is a 3-bit signal. For example, when the divider selection signal is 3'b000, 3'b001, 3'b010, 3'b011, 3'b100, 3'b101, 3'b110, and 3'b111, the clock dividers 550A and 552A may divide the reference clock signal REF_CLK and the feedback clock signal FB_CLK by the first cycle count, second cycle count, third cycle count, fourth cycle count, fifth cycle count, sixth cycle count, seventh cycle count, and eighth cycle count to generate the divided reference clock signal REF_DCLK and divided feedback clock signal FB_DCLK, respectively.

FIG. 7 is a flowchart of a method for operating a delay locked loop device in accordance with some embodiments of the present disclosure. Please refer to both FIG. 3A and FIG. 7. Method 700 shown in FIG. 7 includes steps 710 to 750.

Step 710: Comparing an input clock signal with a reference voltage to generate a first signal. In some embodiments, the receiver 302 may receive the input clock signal CLK which is compared with the reference voltage VREF to generate signal S1 (e.g., the first signal).

Step 720: Generating a reference clock signal based on the input clock signal. In some embodiments, the receiver 302 may generate a reference clock signal REF_CLK based on the input clock signal CLK. Additionally, the waveform of the reference clock signal REF_CLK may be similar to that of the input clock signal CLK.

Step 730: Utilizing a frequency detection and control circuit to detect an operating frequency of the reference clock signal and to generate an enable signal based on a detection result of the operating frequency. In some embodiments, the frequency detection and control circuit 320A is configured to detect operating frequencies of the reference clock signal REF_CLK, which is compatible with DDR4 SDRAM and DDR5 SDRAM, and generate the enable signal PD_EN for the phase detector 330 based on the detection result of the operating frequency.

Step 740: In response to the enable signal in a high logic state, utilizing a phase detector to detect a phase difference between the reference clock signal and a feedback clock signal, which is generated from the first signal through a delay line, to generate a phase detection result. In some embodiments, the phase detector 330 is configured to detect a phase difference between the reference clock signal REF_CLK and the feedback clock signal FB_CLK to generate the phase detection result PD, which is sent to the delay control circuit 340.

Step 750: Utilizing a delay control circuit, based on the phase detection result, to generate a control signal for the delay line to control a delay time of the first signal. In some embodiments, the delay control circuit 340 may generate the control signal DL_CTRL for the delay line 306 based on the phase detection result PD. Additionally, the delay line 306 may be a programmable delay line controlled by a control signal DL_C-TRL from the delay control circuit 340. For example, the delay line 306 may adjust (e.g., increase or decrease) the delay of signal S1 to generate signal S2. Accordingly, the waveform of signal S2, which is delayed by a time interval controlled by the delay line 306, is similar to that of signal S1.

FIG. 8 is a flowchart of a method for operating a delay locked loop device in accordance with still some embodiments of the present disclosure. Please refer to both FIG. 5A and FIG. 8. Method 800 shown in FIG. 8 includes steps 810 to 860.

Step 810: Comparing an input clock signal with a reference voltage to generate a first signal. In some embodiments, the receiver 502 may receive the input clock signal CLK which is compared with the reference voltage VREF to generate signal S1 (e.g., the first signal).

Step 820: Generating a reference clock signal based on the input clock signal. In some embodiments, the receiver 502 may generate a reference clock signal REF_CLK based on the input clock signal CLK. Additionally, the waveform of the reference clock signal REF_CLK may be similar to that of the input clock signal CLK.

Step 830: Utilizing a frequency detection and control circuit to detect an operating frequency of the reference clock signal and to generate a divider selection signal based on a detection result of the operating frequency. In some embodiments, the frequency detection and control circuit 520 is configured to detect operating frequencies of the reference clock signal REF_CLK, which is compatible with DDR4 SDRAM and DDR5 SDRAM, and generate the divider selection signal DIV_SEL for the clock dividers 550A and 552A based on the detection result of the operating frequency.

Step 840: In response to the divider selection signal, utilizing a first clock divider and a second clock divider to generate a divided reference clock signal and a divided feedback clock signal by dividing the reference clock signal and a feedback clock signal, which is generated from the first signal through a delay line, by a particular cycle count. In some embodiments, the first clock divider and the second clock divider may refer to the clock dividers 550A and 552A shown in FIG. 5A, respectively. Additionally, the particular cycle count may be the first to eighth cycle counts R1 to R8 as described in the aforementioned embodiments, depending on the detected operating frequency of the reference clock signal REF_CLK.

Step 850: Utilizing a phase detector to detect a phase difference between the divided reference clock signal and the divided feedback clock signal to generate a phase detection result. In some embodiments, the phase detector 530 is configured to detect a phase difference between the divided reference clock signal REF_D-CLK and the divided feedback clock signal FB_DCLK to generate the phase detection result PD, which is sent to the delay control circuit 540.

Step 860: Utilizing a delay control circuit, based on the phase detection result, to generate a control signal for the delay line to control a delay time of the first signal. In some embodiments, the delay control circuit 540 may generate the control signal DL_CTRL for the delay line 506 based on the phase detection result PD. Additionally, the delay line 506 may be a programmable delay line controlled by a control signal DL_C-

TRL from the delay control circuit 540. For example, the delay line 506 may adjust (e.g., increase or decrease) the delay of signal S1 to generate signal S2. Accordingly, the waveform of signal S2, which is delayed by a time interval controlled by the delay line 306, is similar to that of signal S1.

An aspect of the present disclosure provides a delay locked loop device, which includes a receiver, a delay line, a frequency detection and control circuit, a phase detector, and a delay control circuit. The receiver is configured to compare an input clock signal and a reference voltage to generate a first signal, and generate a reference clock signal based on the input clock signal. The delay line is configured to delay the first signal to generate a second signal based on a delay control signal. The frequency detection and control circuit is configured to detect an operating frequency of the reference clock signal to generate an enable signal. The phase detector is configured to detect, in response to the enable signal in a high logic state, a phase difference between the reference clock signal and a feedback clock signal, which is generated from the second signal, to generate a phase detection result. The delay control circuit is configured to generate the delay control signal for the delay line based on the phase detection result.

Another aspect of the present disclosure provides a delay locked loop device which includes a receiver, a delay line, a frequency detection and control circuit, a first clock divider, a second clock divider, a phase detector, and a delay control circuit. The receiver is configured to compare an input clock signal and a reference voltage to generate a first signal and generate a reference clock signal based on the input clock signal. The delay line is configured to delay the first signal to generate a second signal based on a delay control signal. The frequency detection and control circuit is configured to detect an operating frequency of the reference clock signal to generate a divider selection signal. The first clock divider is configured to divide, based on the divider selection signal, the reference clock signal using a specific cycle count among a plurality of cycle counts to generate a divided reference clock signal. The second clock divider is configured to divide, based on the divider selection signal, a feedback clock signal generated from the second signal to generate a divided feedback clock signal. The phase detector is configured to detect a phase difference between the divided reference clock signal and the divided feedback clock signal to generate a phase detection result. The delay control circuit is configured to generate the delay control signal for the delay line based on the phase detection result.

Yet another aspect of the present disclosure provides a method for use in operating a delay locked loop device which includes a delay line, a frequency detection and control circuit, a phase detector, and a delay control circuit. The method includes the following steps: comparing an input clock signal with a reference voltage to generate a first signal; generating a reference clock signal based on the input clock signal; utilizing the frequency detection and control circuit to detect an operating frequency of the reference clock signal and to generate an enable signal based on a detection result of the operating frequency, in response to the enable signal in a high logic state, utilizing the phase detector to detect a phase difference between the reference clock signal and a feedback clock signal, which is generated from the first signal through the delay line, to generate a phase detection result; and utilizing the delay control circuit, based on the phase detection result, to generate a delay control signal for the delay line to control a delay time of the first signal.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A delay locked loop device, comprising:
a receiver, configured to compare an input clock signal and a reference voltage to generate a first signal, and generate a reference clock signal based on the input clock signal;
a delay line, configured to delay the first signal to generate a second signal based on a delay control signal;
a frequency detection and control circuit, configured to detect an operating frequency of the reference clock signal to generate an enable signal;
a phase detector, configured to detect, in response to the enable signal in a high logic state, a phase difference between the reference clock signal and a feedback clock signal, which is generated from the second signal, to generate a phase detection result; and
a delay control circuit, configured to generate the delay control signal for the delay line based on the phase detection result.

2. The delay locked loop device of claim 1, wherein the operating frequency of the reference clock signal is compatible with DDR4 SDRAM (double data rate fourth-generation synchronous dynamic random access memory) and/ or DDR5 SDRAM (double data rate fifth-generation synchronous dynamic random access memory).

3. The delay locked loop device of claim 1, wherein the frequency detection and control circuit is configured to divide the operating frequency of the reference clock signal by a first cycle count, a second cycle count, a third cycle count, and a fourth cycle count when the detected operating frequency of the reference clock signal being at a first operating frequency, a second operating frequency, a third operating frequency, and a fourth operating frequency, respectively.

4. The delay locked loop device of claim 3, wherein:
the fourth operating frequency is higher than the third operating frequency;
the third operating frequency is higher than the second operating frequency;
the second operating frequency is higher than the first operating frequency;

the fourth cycle count is greater than the third cycle count;
the third cycle count is greater than the second cycle count; and
the second cycle count is greater than the first cycle count.

5. The delay locked loop device of claim 4, wherein the frequency detection and control circuit is further configured to divide the operating frequency of the reference clock signal by a fifth cycle count, a sixth cycle count, a seventh cycle count, and an eighth cycle count when the detected operating frequency of the reference clock signal being at a fifth operating frequency, a sixth operating frequency, a seventh operating frequency, and an eighth operating frequency.

6. The delay locked loop device of claim 5, wherein:
the eighth operating frequency is higher than the seventh operating frequency;
the seventh operating frequency is higher than the sixth operating frequency;
the sixth operating frequency is higher than the fifth operating frequency;
the fifth operating frequency is higher than the fourth operating frequency;
the eighth cycle count is greater than the seventh cycle count;
the seventh cycle count is greater than the sixth cycle count;
the sixth cycle count is greater than the fifth cycle count; and
the fifth cycle count is greater than the fourth cycle count.

7. The delay locked loop device of claim 1, wherein:
the phase detection result is positive in response to the feedback clock signal lagging behind the reference clock signal; and
the phase detection result is negative in response to the feedback clock signal leading the reference clock signal.

8. The delay locked loop device of claim 7, wherein:
when the phase detection result is positive, the delay control signal generated by the delay control circuit is a negative value, and the delay line decreases a delay of the feedback clock signal to synchronize with the reference clock signal; and
when the phase detection result is negative, the delay control signal generated by the delay control circuit is a positive value, and the delay line increases the delay of the feedback clock signal to synchronize with the reference clock signal.

9. The delay locked loop device of claim 1, further comprising:
an amplifier, configured to amplify the second signal to generate a third signal;
a clock tree, configured to generate a fourth signal based on the third signal;
a command decoder, configured to receive a memory access command from a memory controller based on the first signal to generate a fifth signal; and
an off-chip driver, configured to synchronize the fifth signal with the fourth signal to generate an output signal, which is sent to a pad of a memory device.

10. The delay locked loop device of claim 9, wherein the off-chip driver is further configured to generate the feedback clock signal from the fourth signal.

* * * * *